United States Patent
Sasaki et al.

(10) Patent No.: US 7,754,503 B2
(45) Date of Patent: Jul. 13, 2010

(54) METHOD FOR PRODUCING SEMICONDUCTOR DEVICE AND SEMICONDUCTOR PRODUCING APPARATUS

(75) Inventors: Yuichiro Sasaki, Osaka (JP); Katsumi Okashita, Osaka (JP); Keiichi Nakamoto, Osaka (JP); Hiroyuki Ito, Chiba (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/158,906

(22) PCT Filed: Jan. 9, 2008

(86) PCT No.: PCT/JP2008/050152

§ 371 (c)(1),
(2), (4) Date: Jun. 23, 2008

(87) PCT Pub. No.: WO2008/090763

PCT Pub. Date: Jul. 31, 2008

(65) Prior Publication Data

US 2010/0075489 A1 Mar. 25, 2010

(30) Foreign Application Priority Data

Jan. 22, 2007 (JP) .............................. 2007-011941

(51) Int. Cl.
H01L 21/20 (2006.01)
(52) U.S. Cl. .......... 438/16; 257/E21.143; 257/E21.218; 257/E21.266; 257/E21.502; 257/E21.521; 118/723 E

(58) Field of Classification Search ............. 438/12–17, 438/513, 658, 763–778; 257/E21.101, 143, 257/218, 266, 502, 521; 156/345.24–47; 118/715–723 E, 729–732
See application file for complete search history.

(56) References Cited

U.S. PATENT DOCUMENTS

| 4,513,022 | A | * | 4/1985 | Jansen et al. ................. 427/578 |
| 4,585,719 | A | * | 4/1986 | Saitoh et al. ................ 430/57.6 |
| 4,627,991 | A | * | 12/1986 | Seki et al. .................... 438/763 |
| 4,633,811 | A | * | 1/1987 | Maruyama .............. 118/723 E |
| 4,668,479 | A | * | 5/1987 | Manabe et al. ......... 422/186.05 |
| 4,897,281 | A | * | 1/1990 | Arai et al. ....................... 427/8 |
| 4,912,065 | A | | 3/1990 | Mizuno et al. |
| 4,937,205 | A | * | 6/1990 | Nakayama et al. .......... 438/513 |
| 5,302,424 | A | * | 4/1994 | Murai et al. ................. 427/131 |
| 2003/0153101 | A1 | | 8/2003 | Takase et al. |
| 2004/0110343 | A1 | | 6/2004 | Machida et al. |
| 2006/0093731 | A1 | | 5/2006 | Sekine et al. |
| 2007/0111548 | A1 | | 5/2007 | Sasaki et al. |
| 2007/0131354 | A1 | * | 6/2007 | Yokogawa et al. ...... 156/345.34 |
| 2010/0029024 | A1 | * | 2/2010 | Miyake et al. ................. 438/16 |

FOREIGN PATENT DOCUMENTS

| JP | 2002-176003 | 6/2002 |
| JP | 2006-128380 | 5/2006 |
| WO | WO 02/084724 A1 | 10/2002 |
| WO | WO 2006/121131 A1 | 11/2006 |

* cited by examiner

Primary Examiner—Michael S Lebentritt
(74) Attorney, Agent, or Firm—McDermott Will & Emery LLP

(57) ABSTRACT

A plasma of a gas containing an impurity is produced through a discharge in a vacuum chamber, and a plurality of substrates are successively doped with the impurity by using the plasma, wherein a plasma doping condition of a subject substrate is adjusted based on an accumulated discharge time until the subject substrate is placed in the vacuum chamber.

22 Claims, 21 Drawing Sheets

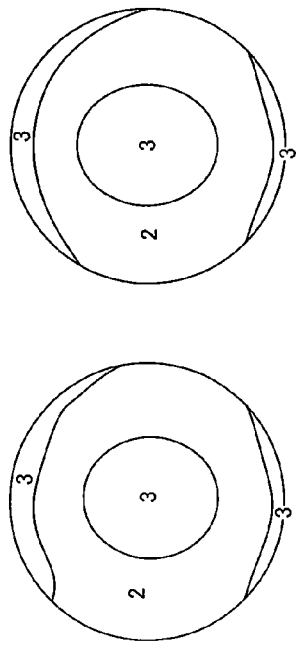
FIG. 11(a) — FIG. 11(e)

FIG. 12(a)

| Maximum accumulated discharge time (min) in preliminary process | Maximum accumulated discharge time(min) in manufacturing process | Number of data points | Correction expression | Mean square of difference between experimental value and calculated value of Rs (Ω/□) | Average of experimental value of Rs (Ω/□) | Mean square of difference between experimental value and calculated value of Rs (%) |
|---|---|---|---|---|---|---|
| 2000 | 5925 | 9 | y=−19.775 Ln(x)+361.395 | 1.6 | 198.2 | 0.82 |

FIG. 12(b)

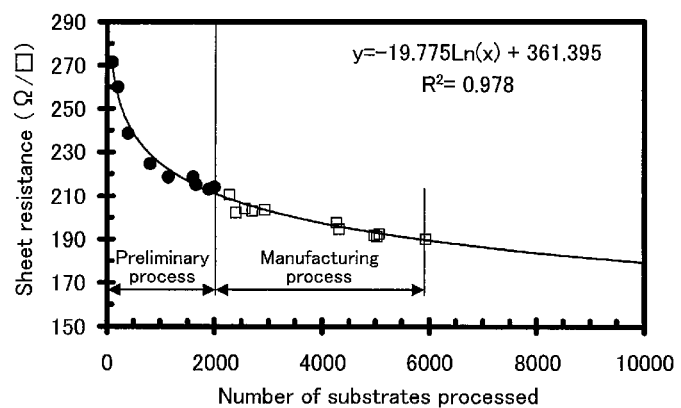

FIG. 13(a)

| Maximum accumulated discharge time (min) in preliminary process | Maximum accumulated discharge time(min) in manufacturing process | Number of data points | Correction expression | Mean square of difference between experimental value and calculated value of Rs ($\Omega/\square$) | Average of experimental value of Rs ($\Omega/\square$) | Mean square of difference between experimental value and calculated value of Rs (%) |
|---|---|---|---|---|---|---|
| 2000 | 5925 | 9 | $y = 396.7001\ x^{-0.0826}$ | 3.6 | 198.2 | 1.83 |

FIG. 13(b)

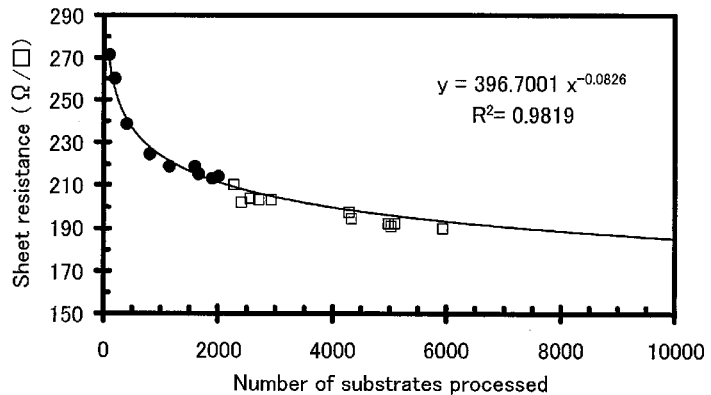

FIG. 14(a)

| Maximum accumulated discharge time (min) in preliminary process | Maximum accumulated discharge time(min) in manufacturing process | Number of data points | Correction expression | Mean square of difference between experimental value and calculated value of Rs (Ω/□) | Average of experimental value of Rs (Ω/□) | Mean square of difference between experimental value and calculated value of Rs (%) |
|---|---|---|---|---|---|---|
| 2000 | 5925 | 9 | $y = 259.1081e^{-0.0001x}$ | 21.0 | 198.2 | 10.60 |

FIG. 14(b)

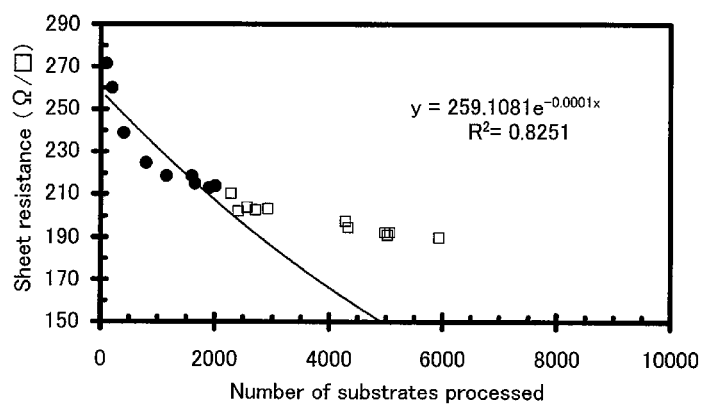

FIG. 15(a)

| Maximum accumulated discharge time (min) in preliminary process | Maximum accumulated discharge time(min) in manufacturing process | Number of data points | Correction expression (approximated by second-order polynominal) | Mean square of difference between experimental value and calculated value of Rs ($\Omega/\square$) | Average of experimental value of Rs ($\Omega/\square$) | Mean square of difference between experimental value and calculated value of Rs (%) |
|---|---|---|---|---|---|---|
| 2000 | 5925 | 9 | y = 0.00002 $x^2$ −0.07821x + 273.94657 | 105.3 | 198.2 | 53.13 |

FIG. 15(b)

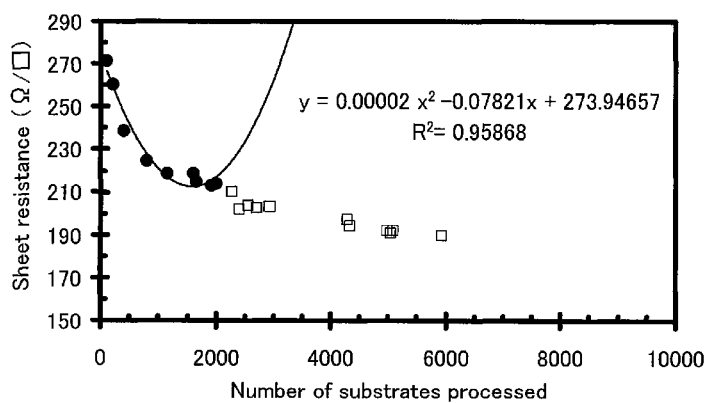

| Maximum accumulated discharge time (min) in preliminary process | Maximum accumulated discharge time(min) in manufacturing process | Number of data points | Correction expression (approximated by third-order polynominal) | Mean square of difference between experimental value and calculated value of Rs ($\Omega/\square$) | Average of experimental value of Rs ($\Omega/\square$) | Mean square of difference between experimental value and calculated value of Rs (%) |
|---|---|---|---|---|---|---|
| 2000 | 5925 | 9 | $y = -0.00000002\ x^3 + 0.00010193\ x^2 - 0.14263564\ x + 284.12938856$ | 343.6 | 198.2 | 173.36 |

FIG. 16(b)

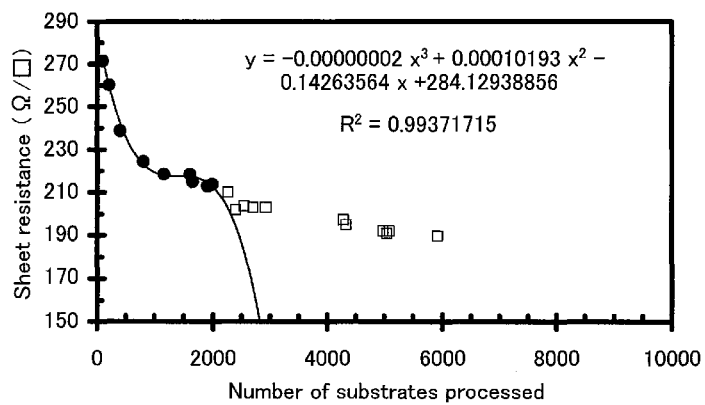

FIG. 17 (a)

| Maximum accumulated discharge time (min) in preliminary process | Maximum accumulated discharge time(min) in manufacturing process | Number of data points | Correction expression (approximated by fourth-order polynominal) | Mean square of difference between experimental value and calculated value of Rs ($\Omega/\square$) | Average of experimental value of Rs ($\Omega/\square$) | Mean square of difference between experimental value and calculated value of Rs (%) |
|---|---|---|---|---|---|---|
| 2000 | 5925 | 9 | $y = 1.459 \times 10^{-11}x^4 - 8.681 \times 10^{-8}x^3 + 1.886 \times 10^{-4}x^2 - 1.845 \times 10^{-1}x + 2.888 \times 10^2$ | 1280.2 | 198.2 | 645.82 |

FIG. 17 (b)

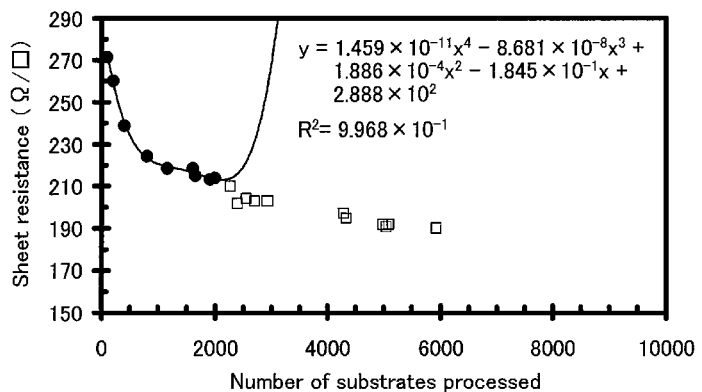

$y = 1.459 \times 10^{-11}x^4 - 8.681 \times 10^{-8}x^3 + 1.886 \times 10^{-4}x^2 - 1.845 \times 10^{-1}x + 2.888 \times 10^2$ $R^2 = 9.968 \times 10^{-1}$

FIG. 18(a)

| Maximum accumulated discharge time (min) in preliminary process | Maximum accumulated discharge time(min) in manufacturing process | Number of data points | Correction expression (approximated by fifth-order polynominal) | Mean square of difference between experimental value and calculated value of Rs ($\Omega/\square$) | Average of experimental value of Rs ($\Omega/\square$) | Mean square of difference between experimental value and calculated value of Rs (%) |
|---|---|---|---|---|---|---|
| 2000 | 5925 | 9 | $y = 4.441 \times 10^{-15}x^5 - 8.455 \times 10^{-12}x^4 - 4.430 \times 10^{-8}x^3 + 1.555 \times 10^{-4}x^2 - 1.744 \times 10^{-1}x + 2.880 \times 10^2$ | 3759.6 | 198.2 | 1896.65 |

FIG. 18(b)

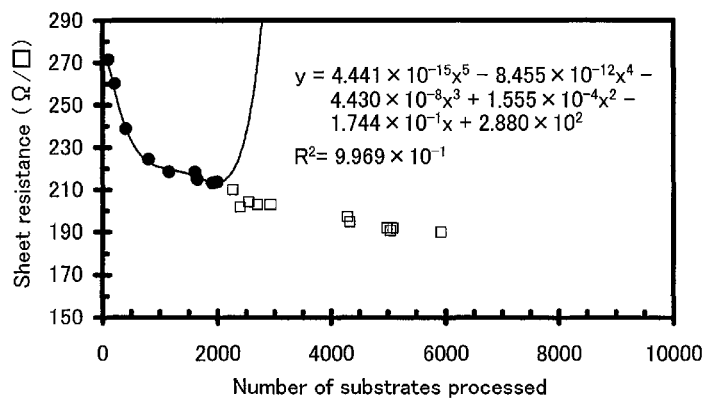

| Form of correction expression | Correction expression | Mean square of difference between experimental value and calculated value of Rs (%) |
|---|---|---|
| Logarithmic | $y = -19.775 \text{Ln}(x) + 361.395$ | 0.82 |
| Power | $y = 396.7001\, x^{-0.0826}$ | 1.83 |
| Exponential | $y = 259.1081 e^{-0.0001x}$ | 10.6 |
| Polynominal (second order) | $y = 0.00002\, x^2 - 0.07821x + 273.94657$ | 53.1 |
| Polynominal (fifth order) | $y = 4.441 \times 10^{-15}x^5 - 8.455 \times 10^{-12}x^4 - 4.430 \times 10^{-8}x^3 + 1.555 \times 10^{-4}x^2 - 1.744 \times 10^{-1}x + 2.880 \times 10^2$ | 1897 |

METHOD FOR PRODUCING SEMICONDUCTOR DEVICE AND SEMICONDUCTOR PRODUCING APPARATUS

RELATED APPLICATIONS

This application is the U.S. National Phase under 35 U.S.C. §371 of International Application No. PCT/JP2008/050152, filed on Jan. 9, 2008, which in turn claims the benefit of Japanese Application No. 2007-011941, filed on Jan. 22, 2007, the disclosures of which Applications are incorporated by reference herein.

TECHNICAL FIELD

The present invention relates to a method for producing a semiconductor device and a semiconductor producing apparatus, and more particularly to a plasma doping process for introducing an impurity into a semiconductor substrate.

BACKGROUND ART

Semiconductor devices produced by forming an impurity region of an intended conductivity type by introducing an impurity into the surface of a semiconductor substrate such as a silicon substrate have been miniaturized, and it is accordingly needed to precisely form shallow impurity regions in minute areas. Known techniques for introducing an impurity into the surface of a solid material include a plasma doping (PD) method of introducing an impurity into the solid material with a low energy after ionizing the impurity (see, for example, Patent Document 1).

Moreover, in order to enhance the reproducibility of the dose to be introduced into a semiconductor substrate in a plasma doping process, the present inventors have proposed a plasma doping method in which discharge is repeated over a certain period of time after the maintenance of the plasma doping apparatus to provide a preliminary period for stabilizing the dose with respect to the accumulated discharge time (see, Patent Document 2).

Specifically, Patent Document 2 discloses that in a plasma doping process using a $B_2H_6$/He plasma, for example, a boron-containing film is gradually formed inside the vacuum chamber in a continuous discharge operation, whereby the boron dose with respect to the accumulated discharge time of plasma doping increases, and that the increase in the boron dose with respect to the accumulated discharge time gradually decreases as the continuous discharge operation is continued, wherein there exists a period of time over which the boron dose is substantially constant with respect to the increase in the accumulated discharge time. Patent Document 2 also discloses that it is possible to obtain a stable dose by using, as the process window, a period of time over which the dose is substantially constant, independent of the accumulated discharge time. FIG. 24 is a flow chart of a plasma doping method disclosed in Patent Document 2 in which the dose can be controlled. As shown in FIG. 24, the plasma doping apparatus is maintained in step S1001, and then the dose to be introduced into the subject substrate is determined by using, as the process window, a period of time over which the dose is substantially constant, independent of the accumulated discharge time in step S1002. Then, in step S1003, a plasma doping process is performed using the dose determined in step S1002 as a target value. Then, after removing a resist used as a mask when introducing an impurity, an annealing process is performed for activating the impurity introduced in the subject substrate.

Patent Document 1: U.S. Pat. No. 4,912,065
Patent Document 2: International Publication WO06/121131

DISCLOSURE OF THE INVENTION

Problems to be Solved by the Invention

However, further experiments by the present inventors have shown that the dose still continues to increase, though slightly, even after reaching the period of time over which the dose is substantially constant, independent of the accumulated discharge time, and that the sheet resistance after annealing is varied among subject substrates which have been plasma-doped in that period of time. Thus, if a plasma doping process is continued under the same condition after reaching this period of time, the dose will exceed the acceptable margin of error.

The present invention has been made in view of the above, and has an object to provide a plasma doping method with which the dose can be controlled with a higher precision even when repeatedly performing a plasma doping process on a plurality of subject substrates over a long period of time, thereby providing a method for producing a semiconductor device and a semiconductor producing apparatus with which it is possible to precisely form reliable impurity regions over a long period of time.

Means for Solving the Problems

In order to achieve the object set forth above, the present inventors have arrived at the invention directed to a plasma doping method for forming an impurity region in the surface of a substrate by exposing the substrate to an impurity-containing plasma, the plasma doping method including a correction step of correcting a plasma doping condition so that the dose of the impurity to be introduced into the substrate becomes equal to a target value, based on the accumulated discharge time, wherein the substrate is plasma-doped with the impurity under the plasma doping condition, which has been corrected in the correction step. The accumulated discharge time herein means the total amount of time of discharge for plasma excitation. In a case where an equal plasma doping time is used for all subject substrates, the accumulated number of substrates processed can be used as a parameter equivalent to the accumulated discharge time.

Specifically, the method for producing a semiconductor device of the present invention is a method for producing a semiconductor device, in which a plasma of a gas containing an impurity is produced through a discharge in a vacuum chamber, and a plurality of substrates are successively doped with the impurity by using the plasma, wherein a plasma doping condition of a subject substrate is adjusted based on an accumulated discharge time until the subject substrate is placed in the vacuum chamber.

In the method for producing a semiconductor device of the present invention, the plasma doping condition of a subject substrate is adjusted based on an accumulated discharge time until the subject substrate is placed in the vacuum chamber, whereby it is possible to optimize the plasma doping condition while taking into consideration the variation of the dose due to the accumulated discharge time. Thus, it is possible to precisely and easily control the dose even when repeatedly performing a plasma doping process on a plurality of substrates over a long period of time.

In one embodiment of the method for producing a semiconductor device of the present invention, before the plurality of substrates are successively doped with the impurity, a reference plasma doping condition is set and a plurality of dummy substrates are successively doped with the impurity under the plasma doping condition to obtain a correlation between the accumulated discharge time and dose or sheet resistance, and the plasma doping condition for the subject substrate is adjusted by using the correlation. In one embodiment, an amount of shift of a dose or a sheet resistance from a target value at an accumulated discharge time until the subject substrate is placed in the vacuum chamber is estimated by using the correlation, and the plasma doping condition for the subject substrate is adjusted based on the estimation.

With such a configuration, the correlation between the accumulated discharge time and the dose or sheet resistance is obtained in advance by using dummy substrates before the manufacturing process, and the plasma doping condition of the subject substrate is adjusted by using the correlation, whereby it is possible to precisely and easily adjust the plasma doping condition.

More specifically, a method for producing a semiconductor device of the present invention is a method for producing a semiconductor device, in which a plasma of a gas containing an impurity is produced through a discharge in a vacuum chamber, and an impurity region is formed in a surface of a substrate by exposing the substrate to the plasma, the method including: a step (a) of setting a first plasma doping condition being a reference condition; a step (b) of correcting the first plasma doping condition to set a second plasma doping condition so that a dose of the impurity to be introduced into the substrate becomes equal to a target value, based on an accumulated discharge time until the substrate is placed in the vacuum chamber; and a step (c) of plasma-doping the substrate with the impurity under the second plasma doping condition set in the step (b) to form the impurity region.

In the method for producing a semiconductor device of the present invention, the first plasma doping condition being a reference condition is set in advance, and a plasma doping process is performed under the second plasma doping condition obtained by correcting the first plasma doping condition so that the dose of the impurity becomes equal to a target value based on the accumulated discharge time. Thus, it is possible to optimize the plasma doping condition while taking into consideration the variation of the dose due to the accumulated discharge time. Therefore, it is possible to precisely and easily control the dose even when repeatedly performing a plasma doping process on a plurality of substrates over a long period of time, whereby it is possible to precisely form impurity regions over a long period of time, thus improving the reliability of semiconductor devices.

In one embodiment, the method for producing a semiconductor device of the present invention further includes a step (d) of cleaning an inside of the vacuum chamber, wherein the accumulated discharge time is an accumulated discharge time since the step (d).

With such a configuration, the inside of the vacuum chamber is reset to the initial state through cleaning, and the accumulated discharge time is counted starting from the reset state, whereby it is possible to precisely correct the plasma doping condition.

In one embodiment of the method for producing a semiconductor device of the present invention, the step (b) includes a step in which at least two separate substrates are plasma-doped with the impurity in the vacuum chamber in advance under the first plasma doping condition at different accumulated discharge times from each other, and a dose of each of the separate substrates is measured, after which the first plasma doping condition is corrected to set the second plasma doping condition based on a relationship between the accumulated discharge time until each of the separate substrates is placed in the vacuum chamber and the dose measured for that substrate.

With such a configuration, the first plasma doping condition is corrected based on doses measured at least two different accumulated discharge times, whereby it is possible to precisely and easily correct the plasma doping condition. Instead of measuring the dose, the sheet resistance value, which is in one-to-one correspondence with the dose, may be measured under a predetermined condition, and the plasma doping condition may be corrected based on the relationship between the accumulated discharge time and the measured value of the sheet resistance.

In a case where the plasma doping condition is corrected based on the relationship between the accumulated discharge time and the measured dose value, a region for dose measurement may be provided in a portion of each of the separate substrates, and the measurement of the dose of each of the separate substrates in the step (b) may be performed by using the region for dose measurement of that substrate.

With such a configuration, the dose can be measured without performing a plasma doping process while providing substrates for dose measurement separately from those for the mass production process, thereby improving the throughput. In such a case, a region for sheet resistance measurement may be provided in a portion of each of the separate substrates in order to measure the sheet resistance instead of measuring the dose.

In a case where the plasma doping condition is corrected based on the relationship between the accumulated discharge time and the measured dose value, the step (b) may include a step in which the target value of the dose of the impurity to be introduced into the substrate is changed, and the first plasma doping condition is corrected to set a third plasma doping condition based on a difference between the changed target value and a dose estimated based on the relationship.

With such a configuration, in a case where the dose target value is changed, the first plasma doping condition is corrected based on the difference between the changed dose target value and the dose estimated based on the relationship between the dose and the accumulated discharge time, whereby it is possible to easily obtain an intended dose. Also in such a case, measured sheet resistance values may be used instead of measured dose values.

In a case where the plasma doping condition is corrected based on the relationship between the accumulated discharge time and the measured dose value, the step (b) may include a step of determining parameters A and B in (Expression 1) below by using the doses measured for the separate substrates.

$$y = -A \cdot \mathrm{Ln}(t) + B \qquad \text{(Expression 1)}$$

(where y is the sheet resistance, Ln is the natural logarithm, and t is the accumulated discharge time)

This configuration and effects thereof will now be described. As a result of conducting various experiments, the present inventors have found the following. In a plasma doping process using a $B_2H_6$/He plasma, for example, a boron-containing film is gradually formed inside the vacuum chamber in a continuous discharge operation, and there exists the relationship of (Expression 1) between the sheet resistance and the accumulated discharge time. Note that the sheet resistance values are those obtained by subjecting the subject substrates to annealing under the same condition.

Based on these findings, the present inventors have arrived at a method to be described below, which is capable of precisely controlling the dose with desirable stability and reproducibility even through a continuous process over a long period of time.

In a continuous process using the same plasma doping apparatus, the period in which the number of substrates processed is from 100 to 2000 is used as a preliminary process before the mass production (a step of determining the parameters A and B of the correction expression (Expression 1)). The parameters A and B of (Expression 1) are calculated by obtaining the relationship between the accumulated discharge time and the dose (accurately, sheet resistance value) in the preliminary process. Since the number of parameters, or variables, is 2, it is possible to calculate the parameters A and B, i.e., to determine the curve represented by (Expression 1), if there are at least 2 data points.

By using (Expression 1) in which the parameters A and B have been thus calculated, the present inventors estimated the change in sheet resistance of the $2000^{th}$ and subsequent substrates based on the accumulated discharge time. Specifically, the estimated value of sheet resistance Rs can be calculated as follows:

$$Rs = -19.78 \cdot Ln(N) + 361.4 \qquad \text{(Expression 3)}$$

where N is the number of substrates processed.

The number N of substrates processed (the number of times of discharge) is essentially the same parameter as the accumulated discharge time t (sec). In the experiments mentioned above, the discharge time for one iteration (the plasma doping time for each substrate) was constant at 60 seconds. However, in a case where the discharge time is varied for each substrate, the sheet resistance is estimated by measuring the accumulated discharge time instead of counting the number of substrates processed. Thus, in (Expression 3), N can be substituted by t/60.

As described above, it is possible to estimate the level of sheet resistance based on the accumulated discharge time (the number of times of discharge) according to (Expression 3). Therefore, it is also possible to estimate the shift of the sheet resistance Rs when the number of times of discharge is N from the target value Rso. The amount of shift, denoted as $\Delta$Rs, can be calculated as follows.

$$\Delta Rs = Rso - (-19.78 \cdot Ln(N) + 361.4) \qquad \text{(Expression 4)}$$

Known parameters that can be used to change the sheet resistance (those constituting the plasma doping condition) include the bias time (the plasma doping time per substrate), the concentration of a gas such as $B_2H_6$, the flow rate of the gas, etc. Thus, these parameters are adjusted according to the number N of times of discharge (i.e., the accumulated discharge time t) in order to correct the shift $\Delta$Rs calculated in (Expression 4). For example, when the number N of times of discharge increases to 6000, the shift $\Delta$Rs of the sheet resistance Rs from the target value Rso (e.g., 210$\Omega$/□) is about 20$\Omega$/□ according to (Expression 4). Then, it can be seen that when the number of times of discharge is 6000, the bias time can be shortened according to the magnitude of $\Delta$Rs. Thus, it is possible to obtain a constant sheet resistance as intended, even when the accumulated discharge time (the number of times of discharge) increases. The sheet resistance value can be adjusted by, for example, reducing the concentration or the flow rate of the $B_2H_6$ gas, in addition to by shortening the bias time.

In a case where the plasma doping condition is corrected based on the relationship between the accumulated discharge time and the measured dose value, the step (b) may include a step of determining parameters A and B in (Expression 2) below by using the doses measured for the separate substrates.

$$y = A \cdot t^{-B} \qquad \text{(Expression 2)}$$

(where y is the sheet resistance, and t is the accumulated discharge time)

With such a configuration, substantially the same effects can be obtained within the practical range even though the precision slightly lowers from that when (Expression 1) is used.

In one embodiment of the method for producing a semiconductor device of the present invention, the step (b) includes a step of correcting a plasma doping time based on an accumulated discharge time until the substrate is placed in the vacuum chamber.

With such a configuration, it is possible, by correcting the plasma doping time, to easily and precisely control the dose while suppressing the influence on the correlation between accumulated discharge time and dose (or sheet resistance) due to changes in other parameters.

In one embodiment of the method for producing a semiconductor device of the present invention, the step (b) includes a step of correcting a concentration of the gas based on an accumulated discharge time until the substrate is placed in the vacuum chamber.

With such a configuration, it is possible to precisely control the dose by, for example, adjusting the gas concentration by increasing the flow rate of the carrier gas, for example.

In one embodiment of the method for producing a semiconductor device of the present invention, the step (b) includes a step of correcting a flow rate of the gas based on an accumulated discharge time until the substrate is placed in the vacuum chamber.

With such a configuration, it is possible to easily adjust the gas flow rate only by adjusting the mass flow controller of the gas supplying device, for example, whereby it is possible to precisely control the dose.

In one embodiment of the method for producing a semiconductor device of the present invention, a distance between a susceptor on which the substrate is provided in the vacuum chamber and a supply section for supplying the gas is kept constant.

With such a configuration, it is possible to easily adjust the dose without moving the susceptor or the gas supplying section to change the positional relationship therebetween. Moreover, it is possible to prevent particles from being produced due to movements of members within the vacuum chamber and to thus suppress the contamination, whereby it is possible to improve the dose controllability.

In one embodiment of the method for producing a semiconductor device of the present invention, the gas contains molecules $B_mH_n$ (where m and n are natural numbers) composed of boron atoms and hydrogen atoms.

In one embodiment of the method for producing a semiconductor device of the present invention, the gas is a mixed gas of a boron atom-containing gas and helium. In such a case, the boron atom-containing gas may be $B_2H_6$, and a concentration of $B_2H_6$ in the mixed gas may be greater than or equal to 0.01% by mass and less than or equal to 1% by mass. Specifically, it is preferred that the $B_2H_6$ gas concentration is greater than or equal to 0.01% by mass and less than or equal to 1% by mass, thereby facilitating the boron introduction. If the $B_2H_6$ gas concentration is less than 0.01% by mass, the boron introduction becomes difficult, and if the $B_2H_6$ gas concentration exceeds 1% by mass, a boron-containing deposit is likely to set on the substrate surface.

In one embodiment of the method for producing a semiconductor device of the present invention, the gas may contain $BF_3$, $AsH_4$ or $PH_3$.

In one embodiment of the method for producing a semiconductor device of the present invention, the substrate may be a silicon substrate.

The semiconductor producing apparatus of the present invention is a semiconductor producing apparatus for forming an impurity region in a surface of a substrate by exposing the substrate to a plasma of a gas containing an impurity, the semiconductor producing apparatus comprising: a vacuum chamber; a gas supplying section for supplying the gas into the vacuum chamber; an exhausting section for exhausting the vacuum chamber; a plasma generating section for making the gas supplied into the vacuum chamber by the gas supplying section into a plasma through a discharge; and a plasma doping condition control section for controlling a plasma doping condition, wherein the plasma doping condition control section sets a first plasma doping condition being a reference condition, and corrects the first plasma doping condition to set a second plasma doping condition so that a dose of the impurity to be introduced into the substrate becomes equal to a target value, based on an accumulated discharge time until the substrate is placed in the vacuum chamber.

With the semiconductor producing apparatus of the present invention, the plasma doping condition control section sets the first plasma doping condition being the reference condition, and corrects the first plasma doping condition to set the second plasma doping condition so that the dose of the impurity to be introduced into the substrate becomes equal to a target value, based on the accumulated discharge time until the substrate is placed in the vacuum chamber. Thus, it is possible to optimize the plasma doping condition while taking into consideration the variation of the dose due to the accumulated discharge time. Therefore, it is possible to precisely and easily control the dose even when repeatedly performing a plasma doping process on a plurality of substrates over a long period of time, whereby it is possible to precisely form impurity regions over a long period of time, thus improving the reliability of semiconductor devices.

In one embodiment of the semiconductor producing apparatus of the present invention, the semiconductor producing apparatus may further include a counter for counting the accumulated discharge time, wherein the plasma doping condition control section corrects the first plasma doping condition to set the second plasma doping condition based on the accumulated discharge time obtained by the counter.

With such a configuration, the correction of the plasma doping condition can be easily realized by simply providing a counter.

EFFECTS OF THE INVENTION

As described above, the present invention makes it possible to precisely control the dose by, for example, determining a first plasma doping condition being a reference condition in advance, measuring the dose at a predetermined accumulated discharge time, estimating the amount of shift of the dose at an accumulated discharge time, at which the subject substrate is to be processed, from the target value based on the measurement, and adjusting the plasma doping condition such as the doping time, the gas concentration or the gas flow rate based on the estimation. Therefore, it is possible to stably form impurity regions with precisely-controlled dose.

BRIEF DESCRIPTION OF THE DRAWINGS

FIGS. 11(a) to 11(e) show the relationship between the sheet resistance distribution and the gas concentration in the method for producing a semiconductor device according to the first embodiment of the present invention.

FIGS. 12(a) and 12(b) show an estimation precision obtained where the relational expression between the sheet resistance value and the accumulated discharge time is in a logarithmic form in the method for producing a semiconductor device according to the first embodiment of the present invention.

FIGS. 13(a) and 13(b) show an estimation precision obtained where the relational expression between the sheet resistance value and the accumulated discharge time is in a power form in the method for producing a semiconductor device according to the first embodiment of the present invention.

FIGS. 14(a) and 14(b) show an estimation precision obtained where the relational expression between the sheet resistance value and the accumulated discharge time is in an exponential form in the method for producing a semiconductor device according to the first embodiment of the present invention.

FIGS. 15(a) and 15(b) show an estimation precision obtained where the relational expression between the sheet resistance value and the accumulated discharge time is in a second-order polynominal being an expansion of $y=-A \cdot Ln(t)+B$ in the method for producing a semiconductor device according to the first embodiment of the present invention.

FIGS. 16(a) and 16(b) show an estimation precision obtained where the relational expression between the sheet resistance value and the accumulated discharge time is in a third-order polynominal being an expansion of y=−A·Ln(t)+B in the method for producing a semiconductor device according to the first embodiment of the present invention.

FIGS. 17(*a*) and 17(*b*) show an estimation precision obtained where the relational expression between the sheet resistance value and the accumulated discharge time is in a fourth-order polynominal being an expansion of y=−A·Ln(t)+B in the method for producing a semiconductor device according to the first embodiment of the present invention.

FIGS. 18(*a*) and 18(*b*) show an estimation precision obtained where the relational expression between the sheet resistance value and the accumulated discharge time is in a fifth-order polynominal being an expansion of y=−A·Ln(t)+B in the method for producing a semiconductor device according to the first embodiment of the present invention.

DESCRIPTION OF REFERENCE NUMERALS

Figure 1:
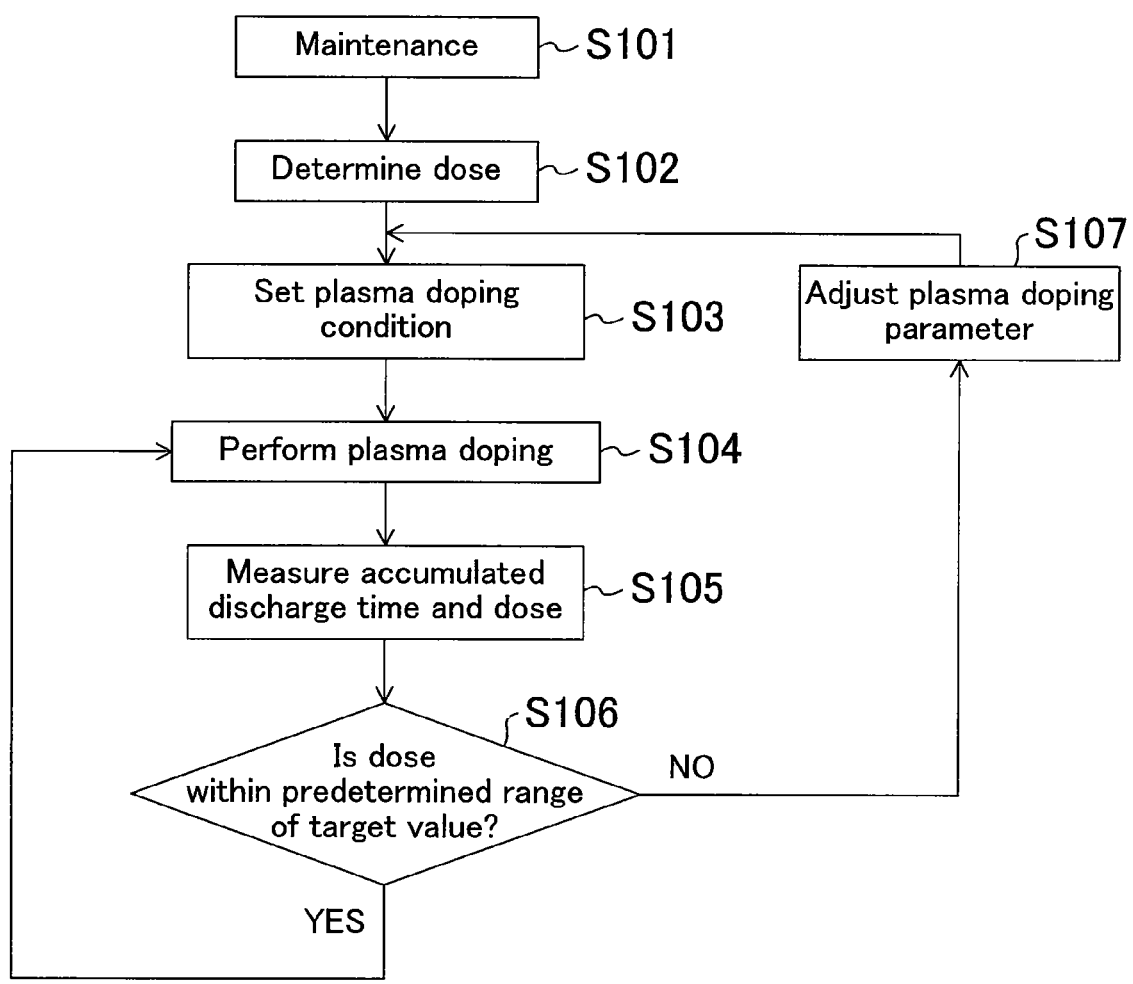
FIG. 1 is a flow chart of a method for producing a semiconductor device according to a first embodiment of the present invention.

1 Silicon substrate
2 Silicon oxide film
3 Silicon layer
4 Silicon oxide film
5A Polycrystalline silicon layer
5 Gate electrode
6 Impurity region
7 Silicon oxide film
8 Impurity region
101 Vacuum chamber
102 Gas supplying device
103 Turbomolecular pump
104 Pressure controlling valve
105 High-frequency power supply
106 Sample electrode
107 Dielectric window
108 Coil
109 Subject substrate
110 High-frequency power supply
111 Coolant supplying unit
112 Dry pump
113 Gas introduction path
114 Main gas path
115 Gas ejection port
116 Matching box
117 VDC monitor
118 Plasma doping condition control device

BEST MODE FOR CARRYING OUT THE INVENTION

First Embodiment

A method for producing a semiconductor device according to a first embodiment of the present invention will now be described with reference to the drawings.

Before describing the method for producing a semiconductor device of the present embodiment, the basic concept of the present invention will be described with respect to plasma doping of boron as an example.

For example, it is known that in a plasma doping process using a $B_2H_6$/He plasma, a boron-containing film is gradually formed inside the vacuum chamber in a continuous discharge operation for a plurality of substrates, whereby the amount of boron supplied from the boron-containing film attached to the vacuum chamber inner wall in some cases becomes greater than the amount of boron supplied from the process gas in the generated plasma. Therefore, as some time elapses from the start of discharge and the accumulated discharge time increases, the boron dose increases, whereby the sheet resistance of the doped substrate decreases. As a result of conducting various experiments, the present inventors have found that the following relationship:

$$Rs = -A \cdot \text{Ln}(t) + B \qquad \text{(Expression 1')}$$

holds between the accumulated discharge time t and the sheet resistance Rs (where A and B are parameters, and Ln is the natural logarithm). Based on the above finding, the present inventors have arrived at the invention as follows, capable of stably improving the dose reproducibility even over a long-term continuous plasma doping process.

Figure 24:
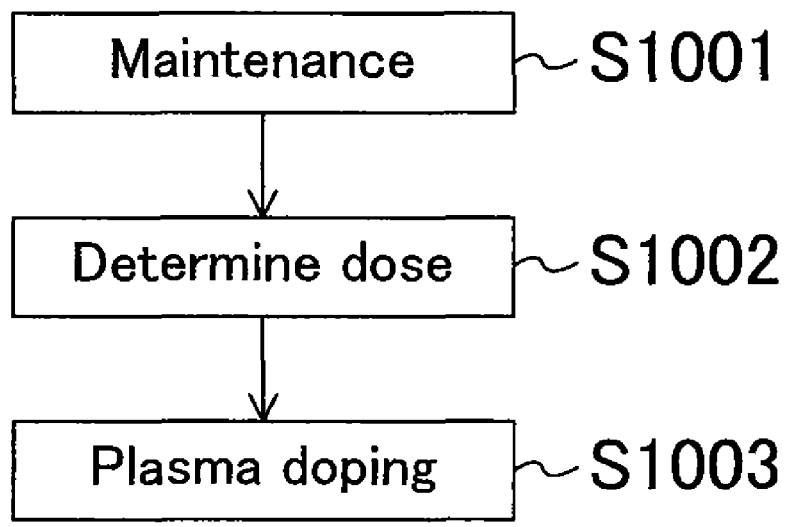
FIG. 24 is a flow chart of a conventional plasma doping method.

FIG. 1 is a flow chart of the method for producing a semiconductor device of the present embodiment. As is apparent from the comparison with the flow chart of the conventional example shown in FIG. 24, a main characteristic of the present embodiment is the provision of a step of adjusting parameters of the plasma doping condition based on the accumulated discharge time so that the target dose is obtained (step S107). Thus, it is possible to optimize the plasma doping condition while taking into consideration the variation of the dose due to the accumulated discharge time, whereby it is possible to obtain a dose stable over a long period of time.

Specifically, the method first performs maintenance such as cleaning of the vacuum chamber of the plasma doping apparatus in step S101, determines the dose target value according to the specifications of the device to be produced in step S102, and then sets the first plasma doping condition being a reference condition in step S103.

Then, in step S104, the subject substrate is plasma-doped under the first plasma doping condition. In step S105, the method measures the accumulated discharge time at the end of the plasma doping process in step S104, i.e., the accumulated discharge time at the point in time when the next subject substrate is placed in the vacuum chamber. In step S105, the method may measure the dose of the impurity introduced into the subject substrate plasma-doped in step S104.

Then, in step S106, the method compares the dose measured in step S105 with the target value determined in step S102 to determine whether the measured dose is within a predetermined range of the target value. Instead of performing step S106, the sheet resistance value may be estimated by using the accumulated discharge time measured in step S105 and various estimation expressions to be described later so as to determine whether the estimated value is within a predetermined range of the target value. In such a case, the dose measurement in step S105 is no longer necessary.

If it is determined in step S106 that the measured dose is within a predetermined range of the target value, step S104 and subsequent steps are repeated.

If it is determined in step S106 that the measured dose is not within a predetermined range of the target value, the process proceeds to step S107 where the parameters of the plasma doping condition are adjusted so that the dose of the impurity introduced into the next subject substrate becomes equal to the target value, and a second plasma doping condition is newly set in step S103. In other words, the first plasma doping condition is corrected to set the second plasma doping condition. Then, the next subject substrate is plasma-doped under the second plasma doping condition in step S104, and step S105 and subsequent steps are performed successively.

There are various ways to correct the plasma doping condition in the present embodiment, which will now be described one by one.

The first correction method measures the accumulated discharge time until the sheet resistance (i.e., the dose) becomes substantially constant after the maintenance of the plasma doping apparatus and the dose at that point in time to thereby obtain a dose curve. Since it is difficult to directly measure the dose, the measurement of dose is replaced by measuring the sheet resistance after activating the implanted impurity through annealing after the plasma doping process.

In the present embodiment, the period in which the number of substrates processed by the plasma doping apparatus is from 100 to 2000 is regarded as being a preliminary process before the mass production (manufacturing) process. In the preliminary process, the method determines the correction expression (accurately, parameters in the correction expression) of the plasma doping condition such as an estimation expression for estimating the sheet resistance value to be described later. Thereafter, the step of correcting various parameters of the plasma doping condition (the correction step in step S107 of FIG. 1) is performed according to the correction expression.

Figure 2:
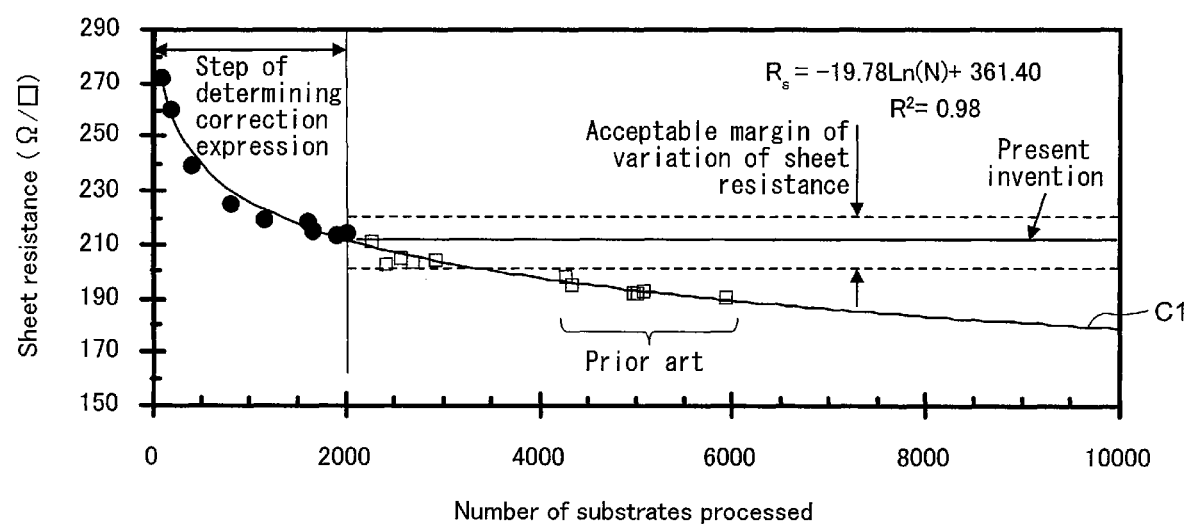
FIG. 2 is a graph illustrating the plasma doping condition correction in the method for producing a semiconductor device according to the first embodiment of the present invention.

FIG. 2 shows the transition of the sheet resistance obtained in the preliminary process described above (the 9 points of data shown as circles). Referring to FIG. 2, with the intended sheet resistance being 210Ω/□ (about $1\times10^{15}$ cm$^{-2}$ in terms of dose), it can be seen that when the number of substrates processed is around 2000, the sheet resistance is 210Ω/□ and the operation is ready to transition to the mass production (manufacturing) process. The transition of the sheet resistance past the 2000$^{th}$ substrate is given by (Expression 1') above, and the parameters A and B in (Expression 1') can be determined by using the 9 points of data (circles) obtained in the preliminary process (the step of determining the correction expression), whereby it is possible to estimate the transition of the sheet resistance past the 2000$^{th}$ substrate.

Specifically, as shown in the curve C1 in FIG. 2, the estimated value of the sheet resistance Rs can be calculated as follows:

$$Rs=-19.78\cdot Ln(N)+361.4 \qquad \text{(Expression 3)}$$

where N is the number of substrates processed. Herein, $R^2=0.98$ of FIG. 2 means the following. $R^2$ is a coefficient of determination widely known in statistics, and is the square of the correlation coefficient. By evaluating $R^2$, it is possible to measure the proportion of the portion, which can be explained (determined) by the number N of substrates processed, of the variance of the 9 sheet resistance values (the 9 points of data shown by circles) obtained in the preliminary process in FIG. 2. $R^2$ takes a value greater than or equal to 0 and less than or equal to 1. If $R^2=0$, it means that the variance of the 9 sheet resistance values obtained in the preliminary process described above is not at all reduced even if the difference in the number N of substrates processed is taken into consideration by (Expression 3), i.e., it means that the number N of substrates processed does not at all determine the sheet resistance Rs. If $R^2=1$, it means that (Expression 3) strictly holds for any number N of substrates processed in the preliminary process described above, i.e., it means that the sheet resistance Rs is completely determined by the logarithmic form of (Expression 3) of the number N of substrates processed. Herein, $R^2$ is evaluated as being 0.98, which is very close to 1, thus indicating that the 9 sheet resistance values obtained in the preliminary process described above are very well explained (determined) by the number N of substrates processed, i.e., the accumulated discharge time.

The number N of substrates processed (the number of times of discharge) is essentially the same parameter as the accumulated discharge time t (sec). In the experiments mentioned above, the discharge time for one iteration (the plasma doping time for each substrate) was constant at 60 seconds. However, in a case where the discharge time is varied for each substrate, the sheet resistance is estimated by measuring the accumulated discharge time instead of counting the number of substrates processed. Thus, in (Expression 3), N can be substituted by t/60. In other words, the exchange between the accumulated discharge time t (sec) and the number N of substrates (wafers) processed up to that point in time can be done, for example, by multiplying the number N of substrates processed by 60 seconds (assuming that the discharge time per substrate is 60 seconds) to thereby obtain the accumulated discharge time t.

With (Expression 3), it is possible not only to well explain the transition of the sheet resistance obtained in the preliminary process, but also to estimate, with a very high precision, the transition of the sheet resistance obtained in the later mass production (manufacturing) process. In other words, it is possible to estimate the level of the sheet resistance at any number of substrates processed (i.e., at any accumulated discharge time). Thus, it is also possible to estimate the shift of the sheet resistance Rs from the target value Rso with a certain number N of substrates processed. The amount of shift, denoted as ΔRs, can be calculated as follows.

$$\Delta Rs=Rso-(-19.78\cdot Ln(N)+361.4) \qquad \text{(Expression 4)}$$

Known parameters that can be used to change the sheet resistance (those constituting the plasma doping condition) include the bias time (the plasma doping time per substrate), the concentration of a gas such as $B_2H_6$, the flow rate of the gas, etc. Thus, these parameters are adjusted according to the number N of times of discharge (i.e., the accumulated discharge time t) in order to correct the shift ΔRs calculated in (Expression 4). For example, when the number N of times of discharge increases to 6000, the shift ΔRs of the sheet resistance Rs from the target value Rso (e.g., 210Ω/□) is about 20Ω/□ according to (Expression 4). Then, it can be seen that when the number of times of discharge is 6000, the bias time can be shortened according to the magnitude of ΔRs. Thus, it is possible to obtain a constant sheet resistance as intended, even when the accumulated discharge time (the number of times of discharge) increases. The sheet resistance value can be adjusted by, for example, reducing the concentration or the flow rate of the $B_2H_6$ gas, in addition to by shortening the bias time.

This is the novel first correction method for correcting the plasma doping condition in the method for producing a semiconductor device of the present embodiment.

Next, the second correction method will be described. FIG. 2 shows the transition of the sheet resistance (squares) obtained during the mass production (manufacturing) process. As shown in FIG. 2, in the range of the number of times of discharge (the number of substrates processed) from 2000 to 3000, the sheet resistance Rs is within the acceptable margin of variation, but when the number of times of discharge exceeds 4000, the sheet resistance Rs falls out of the acceptable margin of variation. Therefore, with a conventional method, a stable sheet resistance can be obtained in the range of the number of times of discharge from 1000 to 2000 after the preliminary process, but when the number of times of discharge is 2000 or more after the preliminary process, the sheet resistance Rs clearly falls below the target value. In other words, the dose becomes too high. In contrast, with the second correction method for correcting the plasma doping condition in the method for producing a semiconductor device of the present embodiment, when the curve C1 in FIG. 2 representing the estimated value of the sheet resistance Rs falls out of the acceptable margin of variation, parameters of the plasma doping condition can be corrected so that the sheet resistance Rs falls within the acceptable margin of variation. In the present embodiment, the acceptable margin of variation of the sheet resistance Rs is set to ±5% of the target value Rso, which is what is typically required.

[Plasma Doping Apparatus]

A plasma doping apparatus for use in carrying out the plasma doping method of the present embodiment will now be described with reference to the cross-sectional view of FIG. 3.

Figure 3:
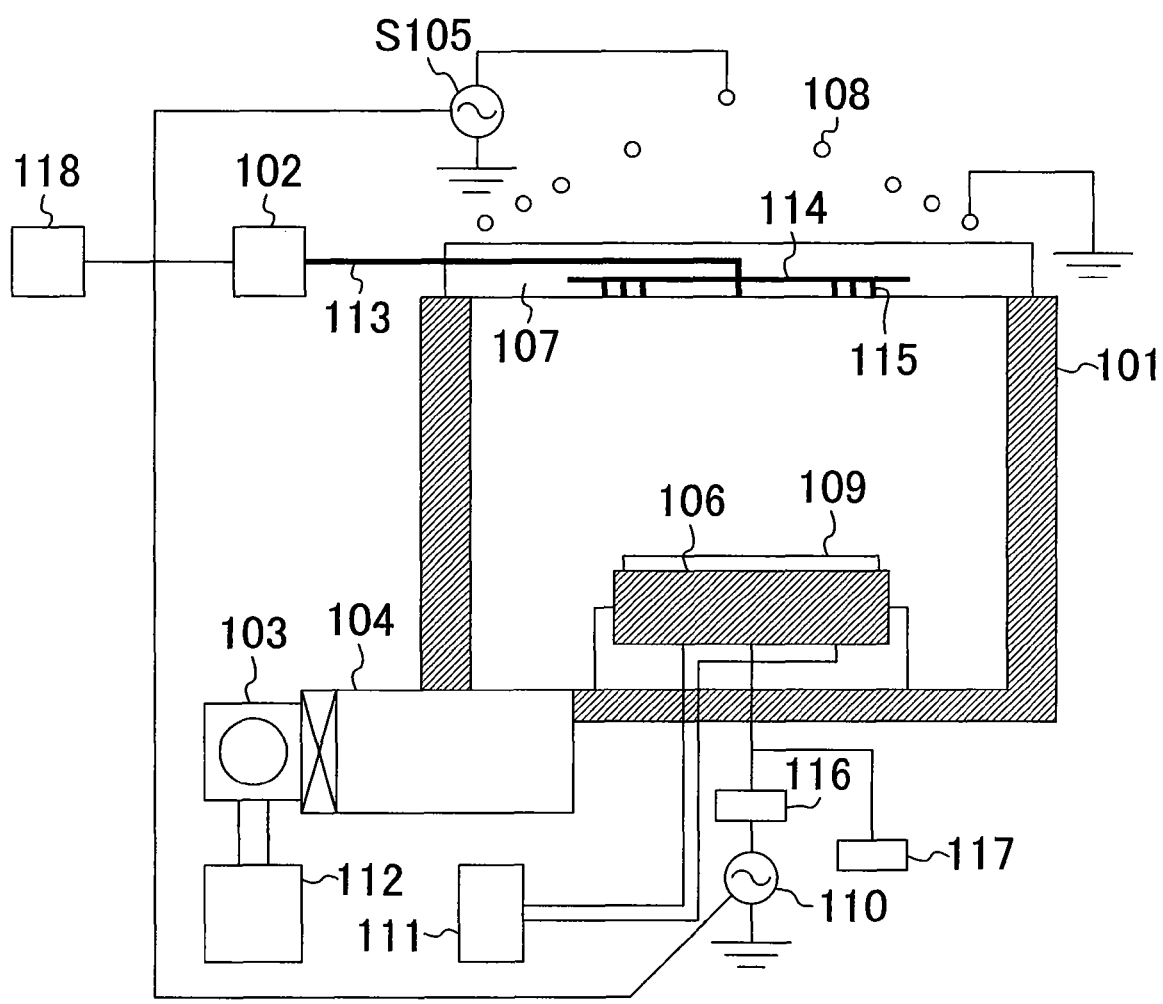
FIG. 3 is a cross-sectional view showing a configuration of a plasma doping apparatus for use in carrying out the method for producing a semiconductor device according to the first embodiment of the present invention.

As shown in FIG. 3, the plasma doping apparatus of the present embodiment includes: a vacuum chamber 101; a gas supplying device 102 for supplying gases into the vacuum chamber; a turbomolecular pump 103 as an exhauster for exhausting the vacuum chamber 101; a pressure controlling valve 104 as a pressure controlling device for controlling the pressure inside the vacuum chamber 101; a sample electrode 106 functioning also as a sample stage on which a subject substrate (substrate) 109 is placed; a coil 108 as a plasma source (a plasma generating device for making a gas into a plasma through discharge) provided in the vicinity of a dielectric window 107 being the ceiling portion of the vacuum chamber 101 opposing the sample electrode 106; a high-frequency power supply 105 for supplying a high-frequency power of 13.56 MHz, for example, to the coil 108; a high-frequency power supply 110 as a voltage source for supplying a voltage to the sample electrode 106; a coolant supplying unit 111 for cooling the sample electrode 106; and a Vdc monitor 117 for monitoring the voltage supplied to the sample electrode 106.

A film containing an impurity may be formed on the inner wall of the vacuum chamber 101. The gas needed for generating a plasma is supplied from the gas supplying device 102 through a gas introduction path 113 and a main gas path 114 in the dielectric window 107 and into the vacuum chamber 101 via a gas ejection port 115. The degree of vacuum inside the vacuum chamber 101 is controlled by the gas supplying device 102, the turbomolecular pump 103, the pressure controlling valve 104 and a dry pump 112. Moreover, a power is supplied to the sample electrode 106 in the vacuum chamber 101 from the high-frequency power supply 110 through a matching box 116. Thus, a power is supplied to a subject substrate 109 mounted on the sample electrode 106, which functions also as a sample stage.

A characteristic of the plasma doping apparatus of the present embodiment is the provision of a plasma doping condition control device 118, which is connected to each of the gas supplying device 102, the high-frequency power supply 105 and the high-frequency power supply 110, for example. The plasma doping condition control device 118 sets a reference plasma doping condition, and adjusts the plasma doping condition so that the dose of the impurity to be introduced into the subject substrate 109 becomes equal to the target value based on the accumulated discharge time until the subject substrate 109 is placed in the vacuum chamber 101. A counter for counting the accumulated discharge time may be further provided, wherein the plasma doping condition control section 118 adjusts the plasma doping condition based on the accumulated discharge time obtained by the counter.

A plasma doping step of performing a plasma irradiation process while placing the subject substrate 109 on the sample electrode 106 functioning also as a sample stage by using the plasma doping apparatus shown in FIG. 3 will now be described.

First, a predetermined gas is introduced into the vacuum chamber 101 being a process chamber from the gas supplying device 102, and the inside of the vacuum chamber 101 is kept at a predetermined pressure by the pressure controlling valve 104 as a pressure controlling device while exhausting the chamber by the turbomolecular pump 103 as an exhauster. Then, a high-frequency power of 13.56 MHz, for example, is supplied from the high-frequency power supply 105 to the coil 108 as a plasma source, thereby generating an inductively-coupled plasma in the vacuum chamber 101. In this state, a silicon substrate, for example, as the subject substrate 109 is placed on the sample electrode 106. Moreover, by supplying a high-frequency power to the sample electrode 106 from the high-frequency power supply 110, the potential of the sample electrode 106 is controlled so that the silicon substrate (the subject substrate 109) as a sample has a negative potential with respect to the plasma. A counter for counting the number of substrates processed (the number of times of discharge) may be attached to the high-frequency power supply 110 for the sample electrode 106, wherein the count is incremented by one each time a silicon substrate as a sample is set on the sample electrode 106. Alternatively, the high-frequency power supply 110 for the sample electrode 106 may be provided with a counter for counting the bias application time, i.e., the accumulated bias time, thereby counting the bias time to measure the accumulated discharge time.

[Step of Determining Correction Expression]

First, the step of determining a correction expression as the preliminary process before the mass production process will be described. Also in this step, the plasma doping apparatus shown in FIG. 3 is used to generate a plasma from a mixed gas of $B_2H_6$ and He, and form a boron-containing film on the inner wall of the vacuum chamber 101. The plasma doping apparatus shown in FIG. 3 has an ordinary apparatus configuration, except for the plasma doping condition control device 118. Normally, after the maintenance such as cleaning of the inner wall of the vacuum chamber 101, the subject substrate 109 as a sample is placed on the sample electrode 106 in the vacuum chamber 101 and the vacuum chamber 101 is evacuated. Then, $B_2H_6$ and He mixed at an intended mixing ratio are supplied into the chamber, a discharge is generated, and a bias is applied to the subject substrate 109 through the sample electrode 106, thus performing a plasma doping process. In the following description, such an ordinary process may not be described.

In the reference plasma doping condition of the present embodiment, the gas mixing ratio between $B_2H_6$ and He was set to 0.05%/99.95%, the total flow rate of the mixed gas to 300 cm$^3$/min (standard state), the source power (the power supplied from the high-frequency power supply 105) to 2000 W, the bias power (the power supplied from the high-frequency power supply 110) to 135 W, and the pressure to 0.9 Pa. The plasma doping time (bias application time) per substrate was set to 60 seconds. Under the reference plasma doping condition, a plurality of silicon substrates having a diameter of 300 mm were plasma-doped continuously in the vacuum chamber 101 immediately after maintenance. The $1^{st}$, $25^{th}$, $50^{th}$, $100^{th}$, $200^{th}$, $400^{th}$, $800^{th}$, $1150^{th}$, $1600^{th}$, $1650^{th}$, $1800^{th}$, $1900^{th}$, $2000^{th}$, $2025^{th}$, and $2075^{th}$ silicon substrate processed were sampled and tested. The sampled silicon substrates were subjected to a heat treatment at 1075° C. for 20 seconds.

In the present embodiment, all the silicon substrates, other than the sampled silicon substrates, are subjected to a heat treatment at 1075° C. for 20 seconds after the plasma doping process and before the sheet resistance measurement. Where an annealing process that gives such a large amount of heat is performed, a large portion of the introduced impurity is activated to be carriers, whereby the sheet resistance and the dose are substantially in inverse proportion to each other. Therefore, where the above annealing condition, i.e., at 1075° C. for 20 seconds, is used, the sheet resistance distribution can be considered a distribution of the dose. This is because the dose and the sheet resistance are in one-to-one correspondence with each other. In the present embodiment, the sheet resistance was measured at 121 points across the principal plane of the substrate having a diameter of 300 mm, excluding an edge portion having a width of 3 mm. In the following description, the value of the sheet resistance is the average of the values measured at 121 points, unless otherwise indicated. In the following description, the sheet resistance uniformity is obtained by the standard deviation (1σ) of the values measured at 121 points. In the present embodiment, the correction expression is determined as will be described below by using sheet resistance values measured for the $100^{th}$-$2000^{th}$ samples (silicon substrates) subjected to a plasma doping process and a heat treatment under conditions described above.

The present inventors examined the relationship of the sheet resistance with each of the bias time (the plasma doping time per substrate), the total flow rate of the mixed gas of $B_2H_6$ and He and the gas mixing ratio of the mixed gas, in order to adjust the plasma doping condition based on the accumulated discharge time so that the dose becomes equal to the target value.

First, the relationship between the bias time and the sheet resistance was examined as follows. The plasma doping condition was such that the gas mixing ratio of the mixed gas of $B_2H_6$ and He was set to 0.05%/99.95%, the total flow rate of the mixed gas to 300 cm$^3$/min (standard state), the source power to 2000 W, the bias power to 135 W, and the pressure inside the vacuum chamber to 0.9 Pa. The bias time (plasma doping time) was set to 5 seconds, 20 seconds, 60 seconds, 90 seconds, 120 seconds, 200 seconds, 400 seconds and 800 seconds. The plasma-doped silicon substrates were subjected to a heat treatment at 1075° C. for 20 seconds. The measurement of the sheet resistance value, and the calculation of the uniformity of the sheet resistance value across the substrate surface are as described above.

Next, the relationship between the total flow rate of the mixed gas of $B_2H_6$ and He and the sheet resistance was examined as follows. The plasma doping condition was such that the source power was set to 2000 W, the bias power to 135 W, the pressure inside the vacuum chamber to 0.9 Pa, and the bias time (plasma doping time) to 60 seconds. The gas mixing ratio of the mixed gas of $B_2H_6$ and He was fixed to 0.05%/99.95%, and the total flow rate of the mixed gas was set to 180 cm$^3$/min (standard state), 300 cm$^3$/min (standard state), 420 cm$^3$/min (standard state) and 540 cm$^3$/min (standard state). The heat treatment, the measurement of the sheet resistance value, and the calculation of the uniformity of the sheet resistance value across the substrate surface are as described above.

Next, the relationship between the gas mixing ratio of the mixed gas of $B_2H_6$ and He and the sheet resistance was examined as follows. The plasma doping condition was such that the total flow rate of the mixed gas of $B_2H_6$ and He was set to 300 cm$^3$/min (standard state), the source power to 2000 W, the bias power to 135 W, the pressure inside the vacuum chamber to 0.9 Pa, and the bias time (plasma doping time) to 60 seconds. The gas mixing ratio of the mixed gas of $B_2H_6$ and He was set to 0.05%/99.95%, 0.04%/99.96%, 0.03%/99.97%, 0.02%/99.98% and 0.01%/99.99%. The heat treatment, the measurement of the sheet resistance value, and the calculation of the uniformity of the sheet resistance value across the substrate surface are as described above.

After examining the relationship between the sheet resistance and the various parameters of the plasma doping condition as described above, the present inventors verified that it was possible to obtain an intended sheet resistance by actually adjusting the plasma doping condition as follows.

Correction Example A

Adjustment Method Using Bias Time

Figure 4:
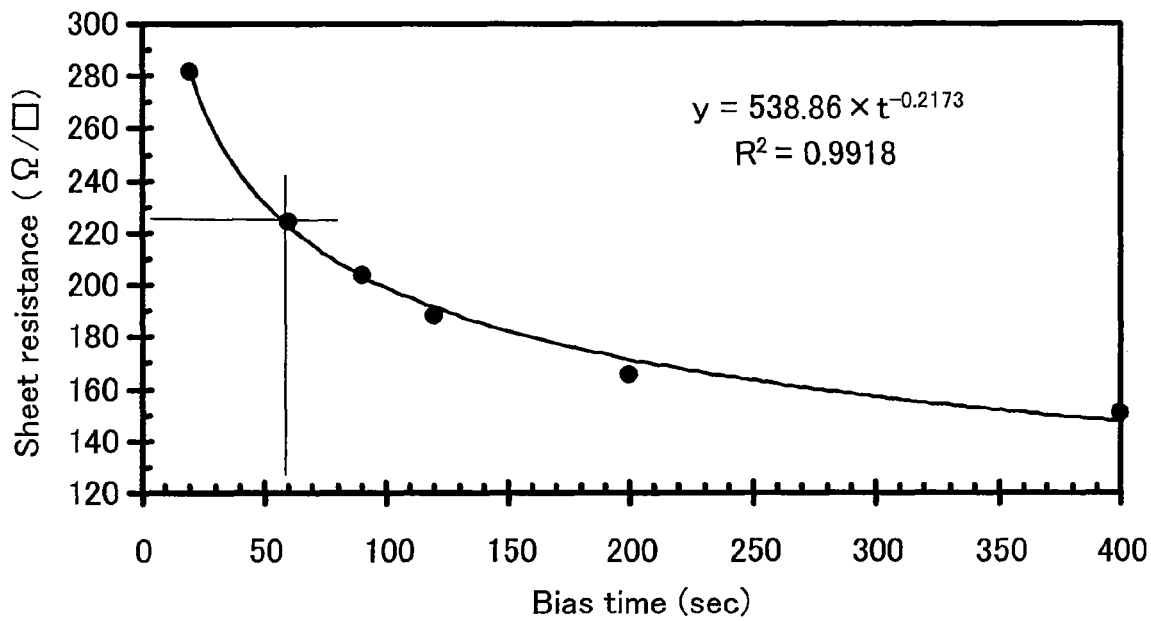
FIG. 4 shows the relationship between the bias time and the sheet resistance, obtained in the method for producing a semiconductor device according to the first embodiment of the present invention.
Figure 5:
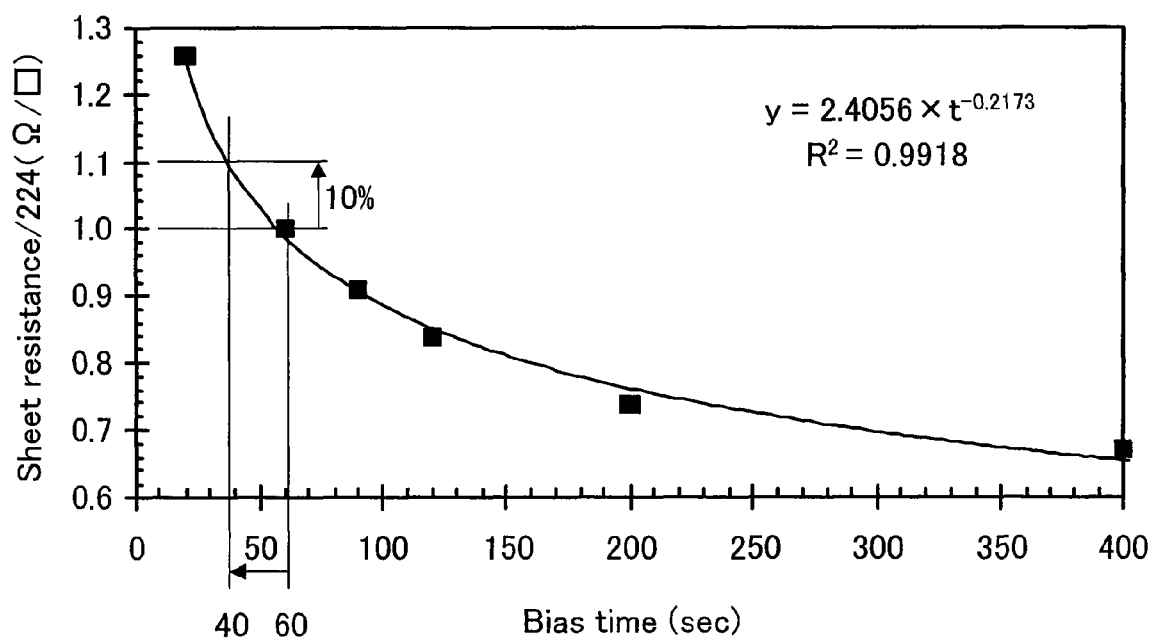
FIG. 5 is a graph obtained by normalizing the ordinate axis of FIG. 4.

When adjustment is made with the bias time for obtaining an intended sheet resistance, the relationship between the bias time and the sheet resistance is obtained in advance in the step of determining the correction expression (the preliminary process). An example of the relationship between the bias time and the sheet resistance obtained as described above is shown in FIG. 4. As shown in FIG. 4, a sheet resistance of 224Ω/□ is obtained with the sample for which the bias time is set to 60 seconds. FIG. 5 is a graph obtained by normalizing the ordinate axis of FIG. 4 by 224Ω/□. Herein, the relationship between the bias time and the sheet resistance can be expressed as follows:

$$y = A \cdot t^{-B} \quad \text{(Expression 2)}$$

(where y is the sheet resistance, and t is the bias time). By substituting two or more measured values shown in FIG. 4 or 5 in the correction expression shown in (Expression 2), A=538.86 and B=−0.2173 are obtained from the measured values shown in FIG. 4, and A=2.4056 and B=−0.2173 are obtained from the measured values shown in FIG. 5. By applying these parameters to (Expression 2), it is possible to obtain the bias time that is required for obtaining an intended sheet resistance. For example, as is clear from FIG. 5, it is expected that the value of the sheet resistance can be increased by about 10% with respect to the sheet resistance when the bias time is 60 seconds if the bias time is shortened by 20 seconds from 60 seconds to 40 seconds. In the present embodiment, according to the estimation expression for estimating the sheet resistance Rs (Rs=−19.78·Ln(t/60)+361.4) obtained by substituting the number N of substrates processed in (Expression 3) above with the accumulated discharge time t, the bias time was shortened to 40 seconds for the sample at an accumulated discharge time of 6475 minutes, which is expected to have a sheet resistance value that is lower by about 10% than the intended value of 210 $\Omega/\square$.

Figure 6:
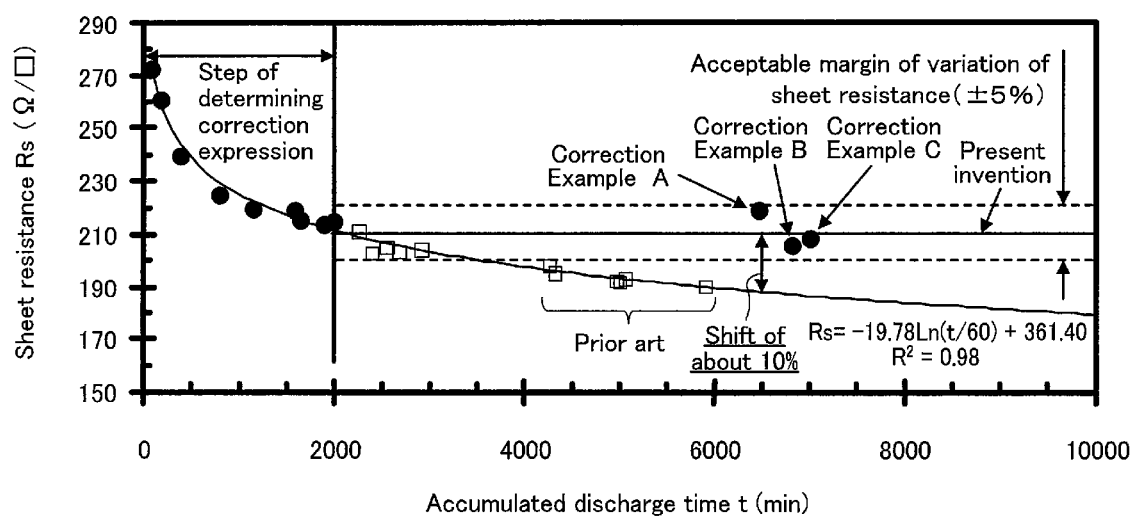
FIG. 6 shows the relationship between the sheet resistance and the accumulated discharge time in the method for producing a semiconductor device according to the first embodiment of the present invention.

As a result, it was possible to obtain a sheet resistance value Rs of 218$\Omega/\square$ as shown in FIG. 6. As shown in Correction Example A of FIG. 6, this sheet resistance value Rs is included within the acceptable margin of variation of the sheet resistance Rs (the range of ±5% about 210$\Omega/\square$), and so it is possible to bring the sheet resistance Rs closer to the target value by using a plasma doping condition correction method based on the bias time. The circles and squares in FIG. 6 represent the same as those in FIG. 2. While $R^2$ in Rs=−19.78·Ln(t/60)+361.4 is 0.98 in FIG. 6, this is a value calculated only for the 9 points of data obtained in the step of determining the correction expression.

The parameters are calculated as A=538.86 and B=−0.2173 from the 6 measured values shown in FIG. 4, and as A=2.4056 and B=−0.2173 from the 6 measured values shown in FIG. 5, based on which it is possible to obtain an estimation expression capable of determining, with a very high precision of $R^2$=0.9918, the sheet resistance difference based on the bias time difference. In contrast, when (Expression 2) is selected, the precision of the various estimation expressions is evaluated by using $R^2$. Therefore, by using (Expression 2) while determining the parameters A and B by substituting two or more measured values in (Expression 2) described in the present correction example, it is possible to precisely determine the relationship between the sheet resistance and the bias time.

Correction Example B

Adjustment Method Using Total Flow Rate of Mixed Gas of $B_2H_6$ and He

Figure 7:
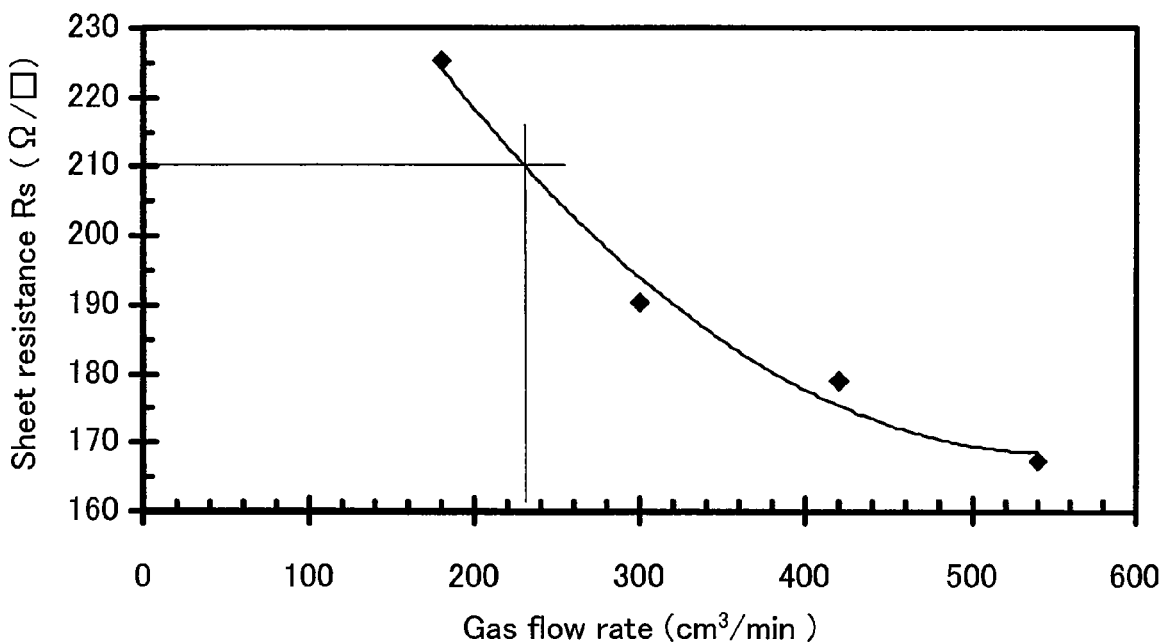
FIG. 7 shows the relationship between the gas flow rate and the sheet resistance, obtained in the method for producing a semiconductor device according to the first embodiment of the present invention.

When adjustment is made with the total flow rate of the mixed gas of $B_2H_6$ and He (hereinafter referred to simply as the "gas flow rate") for obtaining an intended sheet resistance, the relationship between the gas flow rate and the sheet resistance is obtained in advance in the step of determining the correction expression (the preliminary process). An example of the relationship between the gas flow rate and the sheet resistance obtained as described above is shown in FIG. 7. The data shown in FIG. 7 are those obtained when the accumulated discharge time is from 5900 minutes to 6800 minutes. As shown in FIG. 6, the sheet resistance Rs is 210$\Omega/\square$, equal to the target value, for a gas flow rate of 300 cm$^3$/min (standard state) at an accumulated discharge time of 2000 minutes, and as the accumulated discharge time increases thereafter, the shift of the sheet resistance Rs from the target value increases. As a result, the sheet resistance Rs is 190$\Omega/\square$ for a gas flow rate of 300 cm$^3$/min (standard state) when the accumulated discharge time is between 5900 minutes and 6800 minutes, as shown in FIG. 7. In the present embodiment, the gas flow rate is corrected in such a case so that the target value of 210$\Omega/\square$ is obtained as the sheet resistance Rs. As shown in FIG. 7, it can be seen that the corrected value is 230 cm$^3$/min (standard state). In view of this, in the present embodiment, the gas flow rate was reduced to 230 cm$^3$/min (standard state) for a sample at an accumulated discharge time of 6825 minutes.

As a result, it was possible to obtain a sheet resistance Rs of 205$\Omega/\square$ as shown in FIG. 6. It can be seen that, as shown in Correction Example B of FIG. 6, this sheet resistance Rs is included within the acceptable margin of variation of the sheet resistance Rs (the range of ±5% about 210$\Omega/\square$), and so it is possible to bring the sheet resistance Rs closer to the target value by using a plasma doping condition correction method based on the gas flow rate.

Figure 8:
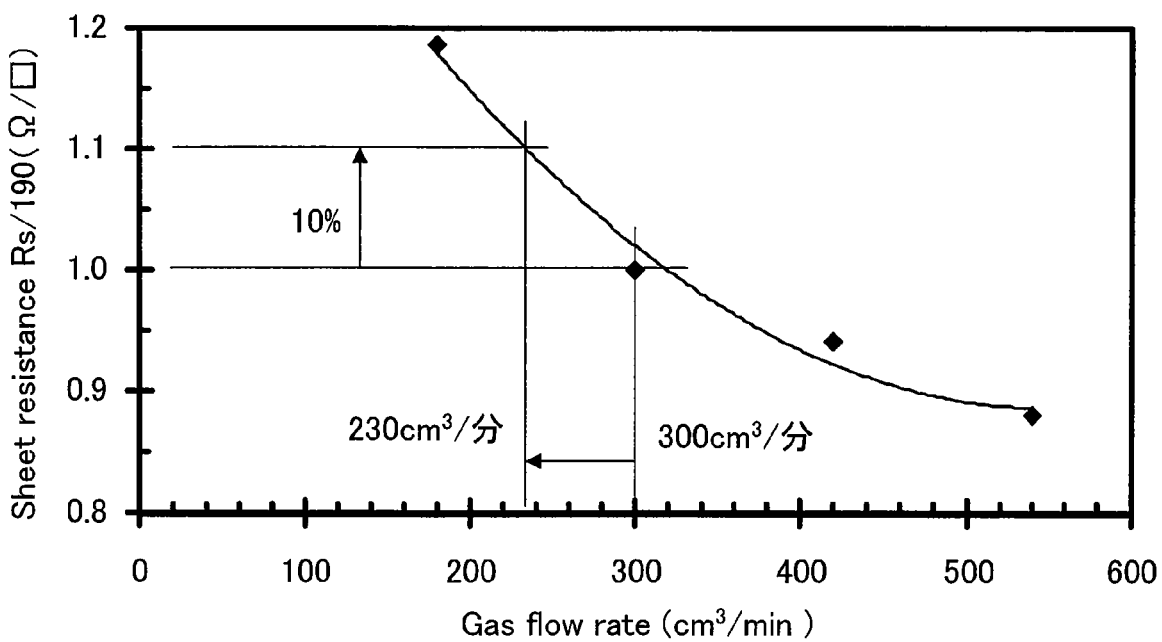
FIG. 8 is a graph obtained by normalizing the ordinate axis of FIG. 7.

In the step of determining the correction expression, the plasma doping condition may be corrected as described above by obtaining, in advance, data shown in FIG. 7 in which the abscissa axis represents the gas flow rate and the ordinate axis represents the sheet resistance value and then producing FIG. 8 by normalizing the ordinate axis of FIG. 7 by 300 cm$^3$/min (standard state).

Correction Example C

Adjustment Method Using Gas Mixing Ratio of Mixed Gas of $B_2H_6$ and He

Figure 9:
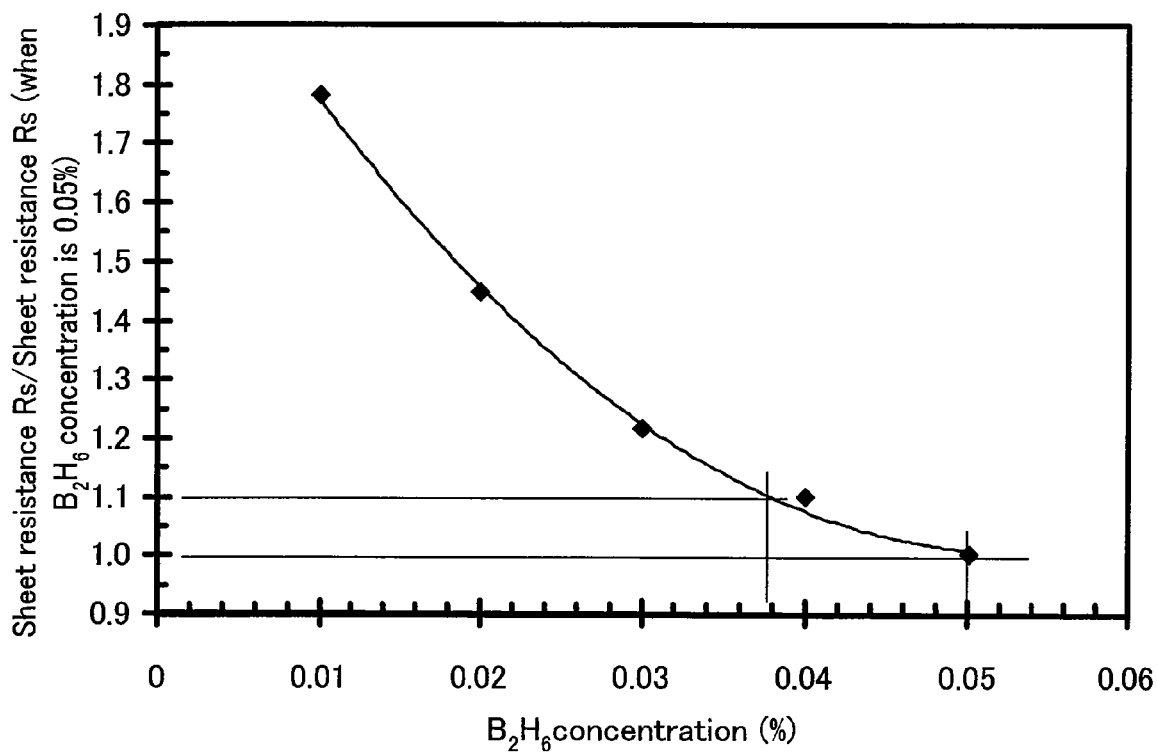
FIG. 9 shows the relationship between the $B_2H_6$ concentration and the sheet resistance, obtained in the method for producing a semiconductor device according to the first embodiment of the present invention.

When adjustment is made with the gas mixing ratio of the mixed gas of $B_2H_6$ and He (hereinafter referred to also as the "$B_2H_6$/He gas concentration") for obtaining an intended sheet resistance, the relationship between the $B_2H_6$ concentration and the sheet resistance is obtained in advance in the step of determining the correction expression (the preliminary process). An example of the relationship between the $B_2H_6$ concentration and the sheet resistance obtained as described above is shown in FIG. 9. The ordinate axis of FIG. 9 is normalized by the sheet resistance obtained when the $B_2H_6$ concentration is 0.05% by mass. The results shown in FIG. 9 are obtained before the maintenance. As shown in FIG. 9, it can be seen that the $B_2H_6$/He gas concentration can be adjusted to 0.038% by mass/99.962% by mass for increasing the sheet resistance by about 10% with respect to the sheet resistance obtained when the $B_2H_6$/He gas concentration is 0.05% by mass/99.95% by mass. Therefore, in the present embodiment, the $B_2H_6$/He gas concentration was set to 0.038% by mass/99.962% by mass for a sample at an accumulated discharge time of 7025 minutes.

As a result, it was possible to obtain a sheet resistance Rs of 208$\Omega/\square$ as shown in FIG. 6. It can be seen that, as shown in Correction Example C of FIG. 6, this sheet resistance Rs is included within the acceptable margin of variation of the sheet resistance Rs (the range of ±5% about 210$\Omega/\square$), and so it is possible to bring the sheet resistance Rs closer to the target value by using a plasma doping condition correction method based on the $B_2H_6$/He gas concentration. In other words, the plasma doping condition can be corrected as described above by obtaining data as shown in FIG. 9 in advance before the maintenance.

Figure 10:
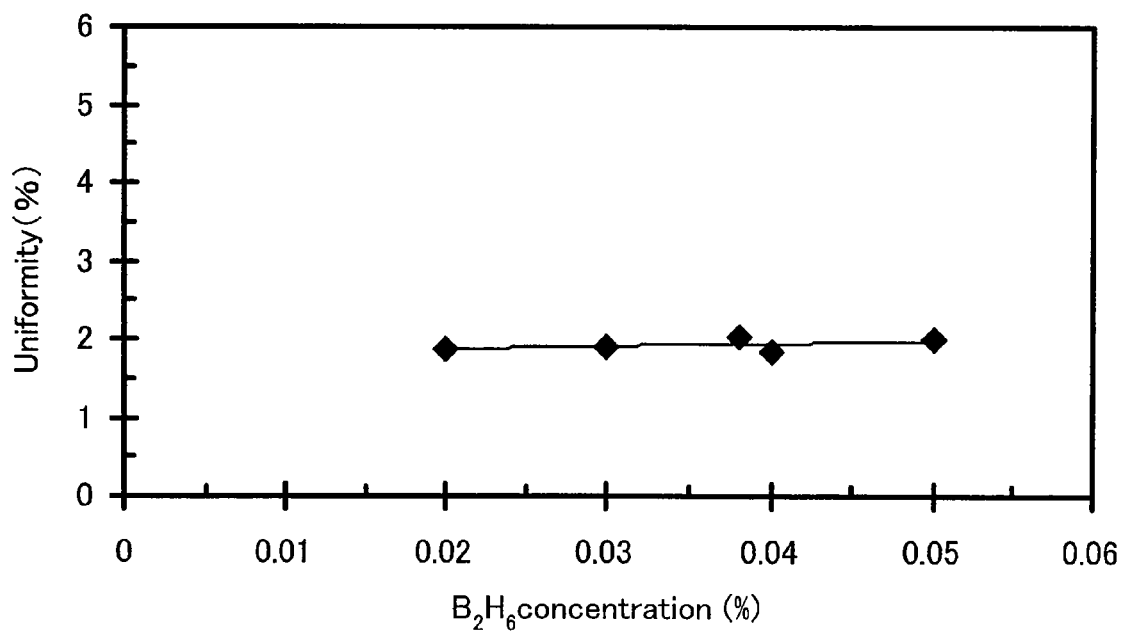
FIG. 10 shows the relationship between the sheet resistance uniformity and the gas concentration in the method for producing a semiconductor device according to the first embodiment of the present invention.

FIG. 10 shows the sheet resistance uniformity when the $B_2H_6$ gas concentration is varied from 0.02% by mass to 0.05% by mass. FIGS. 11(a) to 11(e) show sheet resistance distributions across the wafer (substrate) when the $B_2H_6$ gas concentration is varied from 0.02% by mass to 0.05% by mass. As shown in FIGS. 10 and 11(a) to 11(e), the sheet resistance uniformity for the corrected $B_2H_6$ gas concentration (0.038% by mass) was 2.0%, while that for the uncorrected $B_2H_6$ gas concentration (0.05% by mass) was 1.9-2.1%. Thus, there is provided a significant effect that it is possible to obtain an intended sheet resistance while maintaining a high level of sheet resistance uniformity of about 2% by adjusting the $B_2H_6$/He gas concentration, i.e., the $B_2H_6$ gas concentration, without changing the gas flow rate from the reference 300 cm$^3$/min (standard state).

[Relational Expression Between Sheet Resistance Value And Accumulated Discharge Time Used in Step of Determining Correction Expression]

Next, the relational expression between the sheet resistance value and the accumulated discharge time actually used in adjusting the plasma doping condition using various parameters as described above will be described. In addition to the relational expression in a logarithmic form (e.g., (Expression 3) above):

$$y=-A \cdot \text{Ln}(t)+B \quad \text{(Expression 1)}$$

a relational expression in a power form:

$$y=A \cdot t^{-B} \quad \text{(Expression 2)}$$

(where y is the sheet resistance, and t is the accumulated discharge time) can be used in practice. Thus, by using (Expression 2), it is possible to obtain an intended sheet resistance with substantially the same precision as that when using a relational expression in a logarithmic form.

The relational expression between the sheet resistance value and the accumulated discharge time, can be obtained from, for example, 9 points of data (the sheet resistance during a predetermined accumulated discharge time: see FIGS. 2 and 6) obtained in the preliminary process before the mass production (manufacturing) process, which is the period where the number of substrates processed is 100-2000. The relational expression between the sheet resistance and the accumulated discharge time can also be expressed as follows, for example:

Logarithmic form: $y=-A \cdot \text{Ln}(t)+B$ (Expression 1)

Power form: $y=A \cdot t^{-B}$ (Expression 2)

Exponential form: $y=A \cdot \exp(-B \cdot t)$ (Expression 5)

Polynominal form: Expansion of $y=-A \cdot \text{Ln}(t)+B$ (Expression 6)

(to be later discussed in detail)

where y is the sheet resistance value, t is the accumulated discharge time, and A and B are parameters.

The present inventors estimated the sheet resistance value for samples after an accumulated discharge time of 2000 minutes using each of the various relational expressions above between the sheet resistance value and the accumulated discharge time, and evaluated the estimation precision, thereby determining a preferred relational expression for the present embodiment. The evaluation of the estimation precision was done based on 11 points of data obtained when the accumulated discharge time is between 2000 minutes and 5925 minutes. Specifically, the estimation precision can be obtained as follows. First, the mean square value of the difference is obtained between the 11 points of data (actual sheet resistance measurement values at predetermined points of accumulated discharge time) obtained when the accumulated discharge time is between 2000 minutes and 5925 minutes and the estimated sheet resistance value obtained based on each of the various relational expressions between the sheet resistance value and the accumulated discharge time. Then, the average sheet resistance value is obtained for the 11 points of data obtained when the accumulated discharge time is between 2000 minutes and 5925 minutes. The result of dividing the mean square value by the average value was used as a measure of the estimation precision. The parameters of the various relational expressions to be described below are obtained by using the reference plasma doping condition described above.

FIGS. 12(a) and 12(b) show an estimation precision obtained where the relational expression between the sheet resistance value and the accumulated discharge time (accurately, the number of substrates processed as obtained by dividing the accumulated discharge time by 60 seconds) is in a logarithmic form of (Expression 1). As FIG. 12(b) shows $R^2=0.978$, the transition of the 9 sheet resistance values in the preliminary process can be explained based on the difference in the accumulated discharge time by using (Expression 1). As shown in FIGS. 12(a) and 12(b), when the relational expression in a logarithmic form of (Expression 1) is used, the estimation precision when the accumulated discharge time is between 2000 minutes and 5925 minutes (when the number of substrates processed is between 2000 and 5925) is 0.82%, indicating that it is possible not only to accurately explain the transition of the sheet resistance in the preliminary process but also to precisely estimate the sheet resistance in the subsequent manufacturing process.

FIGS. 13(a) and 13(b) show an estimation precision obtained where the relational expression between the sheet resistance value and the accumulated discharge time (accurately, the number of substrates processed as obtained by dividing the accumulated discharge time by 60 seconds) is in a power form (Expression 2). As FIG. 13(b) shows $R^2=0.9819$, the transition of the 9 sheet resistance values in the preliminary process can be explained based on the difference in the accumulated discharge time by using (Expression 2). As shown in FIGS. 13(a) and 13(b), also when the relational expression in a power form of (Expression 2) is used, the estimation precision when the accumulated discharge time is between 2000 minutes and 5925 minutes (when the number of substrates processed is between 2000 and 5925) is 1.83%, indicating that it is possible not only to accurately explain the transition of the sheet resistance in the preliminary process but also to estimate the sheet resistance in the subsequent manufacturing process with a practical level of precision.

FIGS. 14(a) and 14(b) show an estimation precision obtained where the relational expression between the sheet resistance value and the accumulated discharge time (accurately, the number of substrates processed as obtained by dividing the accumulated discharge time by 60 seconds) is in an exponential form of (Expression 5). As FIG. 14(b) shows $R^2=0.8251$, the transition of the 9 sheet resistance values in the preliminary process can be explained by using (Expression 5) even though the precision deteriorates from that obtained when using (Expression 1) or (Expression 2). However, as shown in FIGS. 14(a) and 14(b), when the relational expression in an exponential form of (Expression 5) is used, the estimation precision when the accumulated discharge time is between 2000 minutes and 5925 minutes (when the number of substrates processed is between 2000 and 5925) significantly deteriorates to 10.60%. Thus, where the relational expression between the sheet resistance value and the accumulated discharge time is defined in an exponential form, the transition of the sheet resistance in the preliminary process can be explained, but if the transition of the sheet resistance in the subsequent manufacturing process is estimated based on that relational expression and the plasma doping condition is corrected based on the estimation, the obtained sheet resistance value is shifted from the target value by 10% or more. Therefore, it is not preferred that the relational expression between the sheet resistance value and the accumulated discharge time is in an exponential form.

FIGS. 15(a) and 15(b) show an estimation precision obtained where the relational expression between the sheet resistance value and the accumulated discharge time (accurately, the number of substrates processed as obtained by dividing the accumulated discharge time by 60 seconds) is in a second-order polynominal being an expansion of $y=-A \cdot \text{Ln}(t)+B$, FIGS. 16(a) and 16(b) show an estimation precision obtained where the relational expression between the sheet resistance value and the accumulated discharge time (accurately, the number of substrates processed as obtained by dividing the accumulated discharge time by 60 seconds) is in a third-order polynominal being an expansion of y=−A·Ln(t)+B, FIGS. 17(a) and 17(b) show an estimation precision obtained where the relational expression between the sheet resistance value and the accumulated discharge time (accurately, the number of substrates processed as obtained by dividing the accumulated discharge time by 60 seconds) is in a fourth-order polynominal being an expansion of y=−A·Ln(t)+B, and FIGS. 18(a) and 18(b) show an estimation precision obtained where the relational expression between the sheet resistance value and the accumulated discharge time (accurately, the number of substrates processed as obtained by dividing the accumulated discharge time by 60 seconds) is in a fifth-order polynominal being an expansion of y=−A·Ln(t)+B. As FIGS. 15(b), 16(b), 17(b) and 18(b) show $R^2$=0.95868, $R^2$=0.99371715, $R^2$=9.968×10$^{-1}$ (i.e., 0.9968) and $R^2$=9.969×10$^{-1}$ (i.e., 0.9969), respectively, the transition of the 9 sheet resistance values in the preliminary process can be explained, by using second-, third-, fourth- and fifth-order polynominals each being an expansion of y=−A·Ln(t)+B, based on the difference in the accumulated discharge time with a precision as high as that obtained when using (Expression 1) or (Expression 2). However, the estimation precision when the accumulated discharge time is between 2000 minutes and 5925 minutes (when the number of substrates processed is between 2000 and 5925) is 53.13% using the second-order polynominal being an expansion of y=−A·Ln(t)+B as shown in FIGS. 15(a) and 15(b), the estimation precision when the accumulated discharge time is between 2000 minutes and 5925 minutes (when the number of substrates processed is between 2000 and 5925) is 173.36% using the third-order polynominal being an expansion of y=−A·Ln(t)+B as shown in FIGS. 16(a) and 16(b), the estimation precision when the accumulated discharge time is between 2000 minutes and 5925 minutes (when the number of substrates processed is between 2000 and 5925) is 645.82% using the fourth-order polynominal being an expansion of y=−A·Ln(t)+B as shown in FIGS. 17(a) and 17(b), and the estimation precision when the accumulated discharge time is between 2000 minutes and 5925 minutes (when the number of substrates processed is between 2000 and 5925) is 1896.65% using the fifth-order polynominal being an expansion of y=−A·Ln(t)+B as shown in FIGS. 18(a) and 18(b). Thus, where a relational expression in a polynominal form being an expansion of y=−A·Ln(t)+B is used, the transition of the sheet resistance in the preliminary process can be explained, but the estimation precision for estimating the transition of the sheet resistance in the subsequent manufacturing process is quite poor for any order, and it is difficult to correct the plasma doping condition to match the sheet resistance value with the target value by using any of these expressions as the relational expression between the sheet resistance value and the accumulated discharge time.

Figures 19A, 19B:
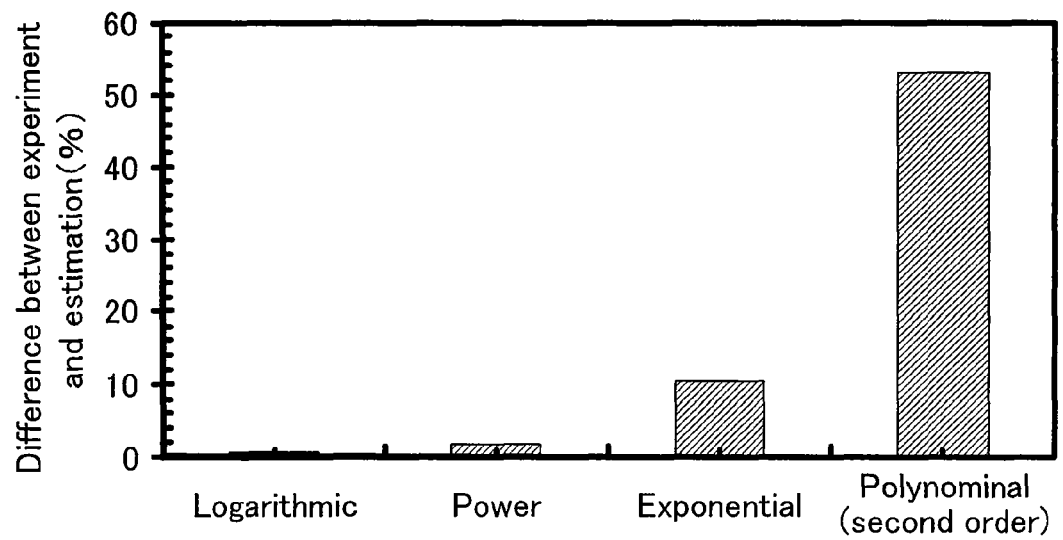
FIGS. 19(*a*) and 19(*b*) show the overall evaluation of sheet resistance value estimation precisions using the various relational expressions between the sheet resistance value and the accumulated discharge time in the method for producing a semiconductor device according to the first embodiment of the present invention.

FIGS. 19(a) and 19(b) show the overall evaluation of sheet resistance value estimation precisions using the various relational expressions above. As shown in FIGS. 19(a) and 19(b), the power form of (Expression 2) is usable, other than the logarithmic form of (Expression 1), as the relational expression between the sheet resistance value and the accumulated discharge time (accurately, the number of substrates processed as obtained by dividing the accumulated discharge time by 60 seconds) for use in the step of determining the correction expression, and it can be seen that the use of the power form of (Expression 2) produces substantially the same effect as that obtained when using the logarithmic form of (Expression 1).

Examples

An example of the method for producing a semiconductor device of the present embodiment using the plasma doping condition correction based on the accumulated discharge time of the present invention as described above will now be described with reference to the drawings.

FIGS. 20(a) to 20(h) are cross-sectional views showing steps in the method for producing a semiconductor device of the present invention.

Figure 20A:
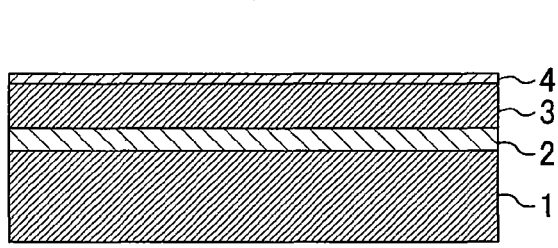
FIGS. 20(*a*) to 20(*h*) are cross-sectional views showing steps in the method for producing a semiconductor device according to the first embodiment of the present invention.

First, as shown in FIG. 20(a), there is provided an SOI (silicon on insulator) substrate formed by attaching an n-type silicon layer 3 on the surface of a silicon substrate 1 with a silicon oxide film 2 being interposed therebetween, and a silicon oxide film 4 is formed as a gate insulating film on the surface of the SOI substrate.

Figure 20E:
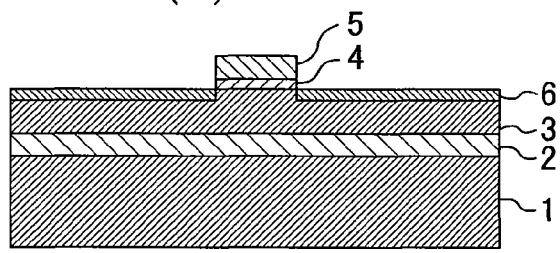
Figure 20B:
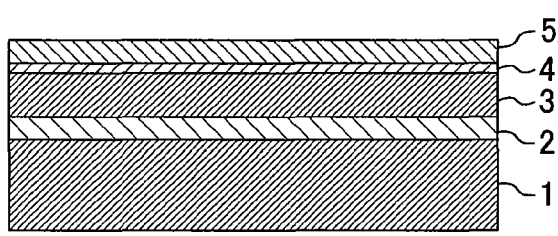
Figure 20F:
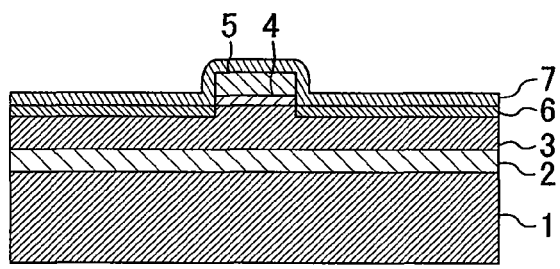
Figure 20C:
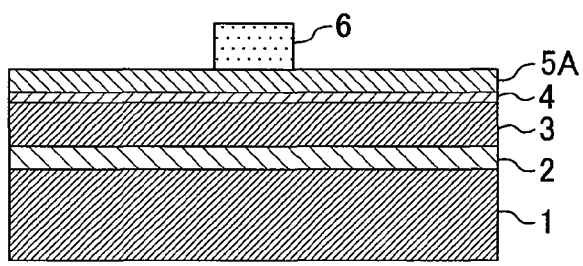
Figure 20G:
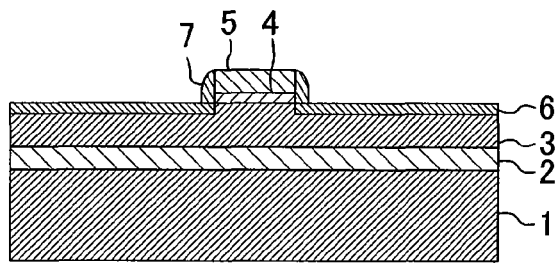
Figure 20D:
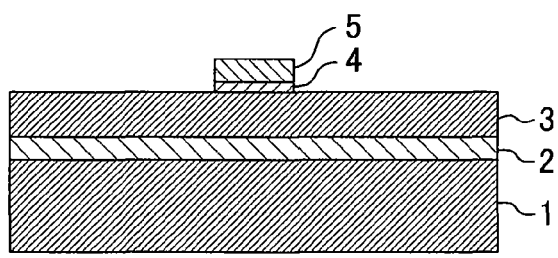

Then, as shown in FIG. 20(b), a polycrystalline silicon layer 5A to be the gate electrode is formed on the silicon oxide film 4, after which, as shown in FIG. 20(c), a mask R covering the gate electrode forming region is formed on the polycrystalline silicon layer 5A by photolithography. Then, as shown in FIG. 20(d), the polycrystalline silicon layer 5A is patterned by using the mask R to form a gate electrode 5. In this process, a portion of the silicon oxide film 4 that is beside the gate electrode 5 is etched away. Then, as shown in FIG. 20(e), a plasma doping process is performed by using the gate electrode 5 as a mask to introduce boron, for example, into the silicon layer 3, thereby forming a shallow p-type impurity region 6 where the depth of implantation is greater than or equal to about 5 nm and less than or equal to 20 nm and the dose is greater than or equal to about $1\times10^{14}$ cm$^{-2}$ and less than or equal to $1\times10^{16}$ cm$^{-2}$. In the plasma doping process, the plasma doping condition correction based on the accumulated discharge time of the present invention as described above is performed.

Then, as shown in FIG. 20(f), a silicon oxide film 7 is formed over the entire surface of the substrate by an LPCVD (low pressure chemical vapor deposition) method, for example, and then the silicon oxide film 7 is etched back by anisotropic etching. Then, as shown in FIG. 20(g), there remains the silicon oxide film 7 only on the side wall of the gate electrode 5.

Figure 20H:
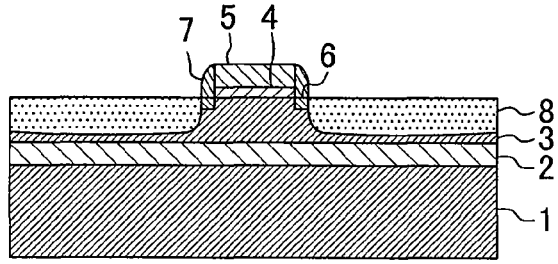

Then, as shown in FIG. 20(h), an ion implantation process is performed by using the silicon oxide film 7 and the gate electrode 5 as a mask to implant the silicon layer 3 with boron, thereby forming a p-type impurity region 8 to be the source-drain region. Then, a heat treatment is performed to activate the implanted boron ions.

Through the steps as described above, there is formed an MOSFET (metal oxide semiconductor field effect transistor) in which a shallow extension region being the p-type impurity region 6 is formed inside the source-drain region being the p-type impurity region 8.

In the step of forming the shallow p-type impurity region 6 as shown in FIG. 20(e), the plasma doping process is performed by using the plasma doping apparatus shown in FIG. 3, for example, wherein an intended dose is obtained by one of the correction methods described above, i.e., by adjusting the plasma doping time, by adjusting the gas concentration or by adjusting the gas flow rate, while keeping a constant distance between the sample electrode 106 as a susceptor and the gas ejection port 115 for supplying the gas. In the example described above, it was possible to precisely form the p-type impurity region 6 having a predetermined impurity concentration while maintaining a high level of sheet resistance uniformity of about 2%. Specifically, the number of substrates that can be produced successively with the sheet resistance of the p-type impurity region 6 being within an acceptable margin of variation of ±5% was at least 5000 or more with the plasma doping time per substrate being 60 seconds. This is 5000 minutes or more in terms of the discharge time. With conventional methods, the number of substrates that can be produced successively with such a high precision is about 2000 (i.e., about 2000 minutes in terms of the discharge time), indicating that the present invention significantly improves the processing capacity.

Figure 21:
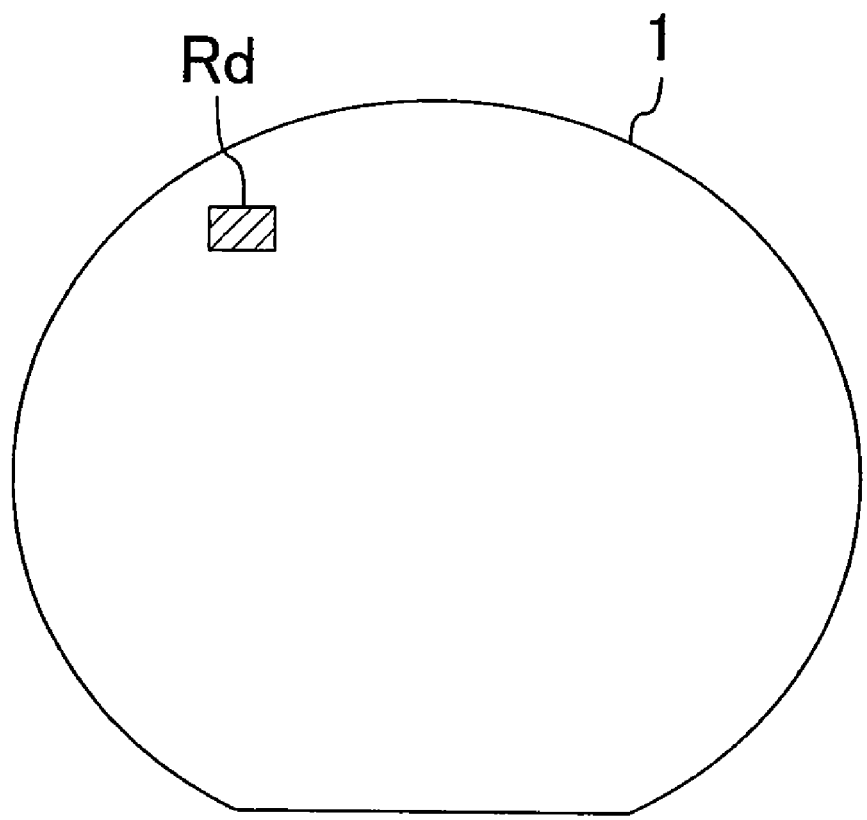
FIG. 21 shows a region Rd for dose (or sheet resistance) measurement provided in the subject substrate in the method for producing a semiconductor device according to the first embodiment of the present invention.

In the step of determining the correction expression (the preliminary process), a separately-provided dummy wafer may be used for the dose (or sheet resistance) measurement, or a measurement region Rd having a size of about 1 cm×1 cm, for example, may be provided on the silicon substrate (subject substrate) 1 as shown in FIG. 21, wherein the region Rd is used for the dose (or sheet resistance) measurement.

Second Embodiment

A method for producing a semiconductor device according to a second embodiment of the present invention will now be described with reference to the drawings.

Figure 22:
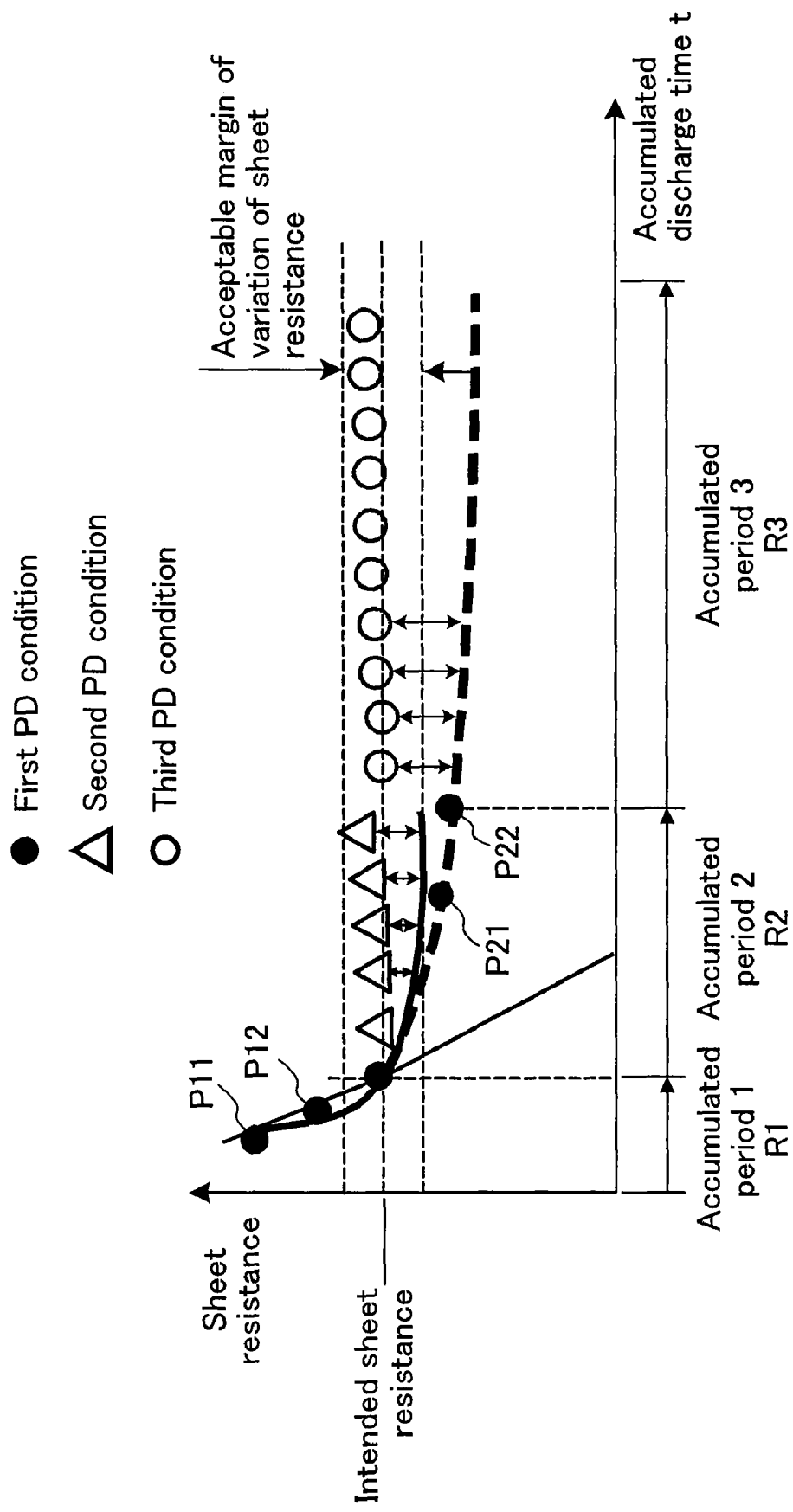
FIG. 22 is a graph illustrating a method for correcting the plasma doping condition in a method for producing a semiconductor device according to a second embodiment of the present invention.

FIG. 22 is a graph illustrating a method for correcting the plasma doping condition in a method for producing a semiconductor device of the present embodiment. The plasma doping condition correction method of the present embodiment differs from that of the first embodiment as follows.

Specifically, as shown in FIG. 22, a first plasma doping condition being a reference condition is first set (see step S103 in FIG. 1), and then a plasma doping process is performed under the first plasma doping condition during a period R1 of accumulated discharge time. At two points P11 and P12 of accumulated discharge time within the period R1, for example, substrates are plasma-doped under the first plasma doping condition, and then the dose (sheet resistance) of each of the substrates is measured. Then, using these measured values, the method obtains the relationship between the accumulated discharge time and the dose (sheet resistance) for the plasma doping apparatus up to the period R1, and determines one of the various correction expressions described in the first embodiment to correct the first plasma doping condition, thus obtaining the second plasma doping condition, based on the determined correction expression.

Then, the condition is switched from the first plasma doping condition to the second plasma doping condition when the sheet resistance of the sample plasma-doped under the first plasma doping condition decreases and becomes substantially equal to the target value as the accumulated discharge time increases, and a plasma doping process is performed under the second plasma doping condition until the sheet resistance falls out of the acceptable margin of variation (i.e., in the period R2 of accumulated discharge time). At two points P21 and P22 of accumulated discharge time within the period R2, for example, substrates are plasma-doped under the first plasma doping condition, and then the dose (sheet resistance) of each of the substrates is measured. Then, using these measured values, the method obtains the relationship between the accumulated discharge time and the dose (sheet resistance) for the plasma doping apparatus up to the period R2, and determines one of the various correction expressions described in the first embodiment to correct the first plasma doping condition, thus obtaining the third plasma doping condition, based on the determined correction expression.

Then, the condition is switched from the second plasma doping condition to the third plasma doping condition, and a plasma doping process is performed under the third plasma doping condition until the sheet resistance falls out of the acceptable margin of variation (i.e., in the period R3 of accumulated discharge time).

Thereafter, plasma doping conditions are switched from one to another as described above.

According to the present embodiment, the plasma doping condition is adjusted from one setting to another as the accumulated discharge time increases, and it is therefore possible to precisely control the dose even when repeatedly performing a plasma doping process on a plurality of substrates over a long period of time, whereby it is possible to significantly improve the productivity.

Third Embodiment

A method for producing a semiconductor device according to a third embodiment of the present invention will now be described with reference to the drawings.

Figure 23:
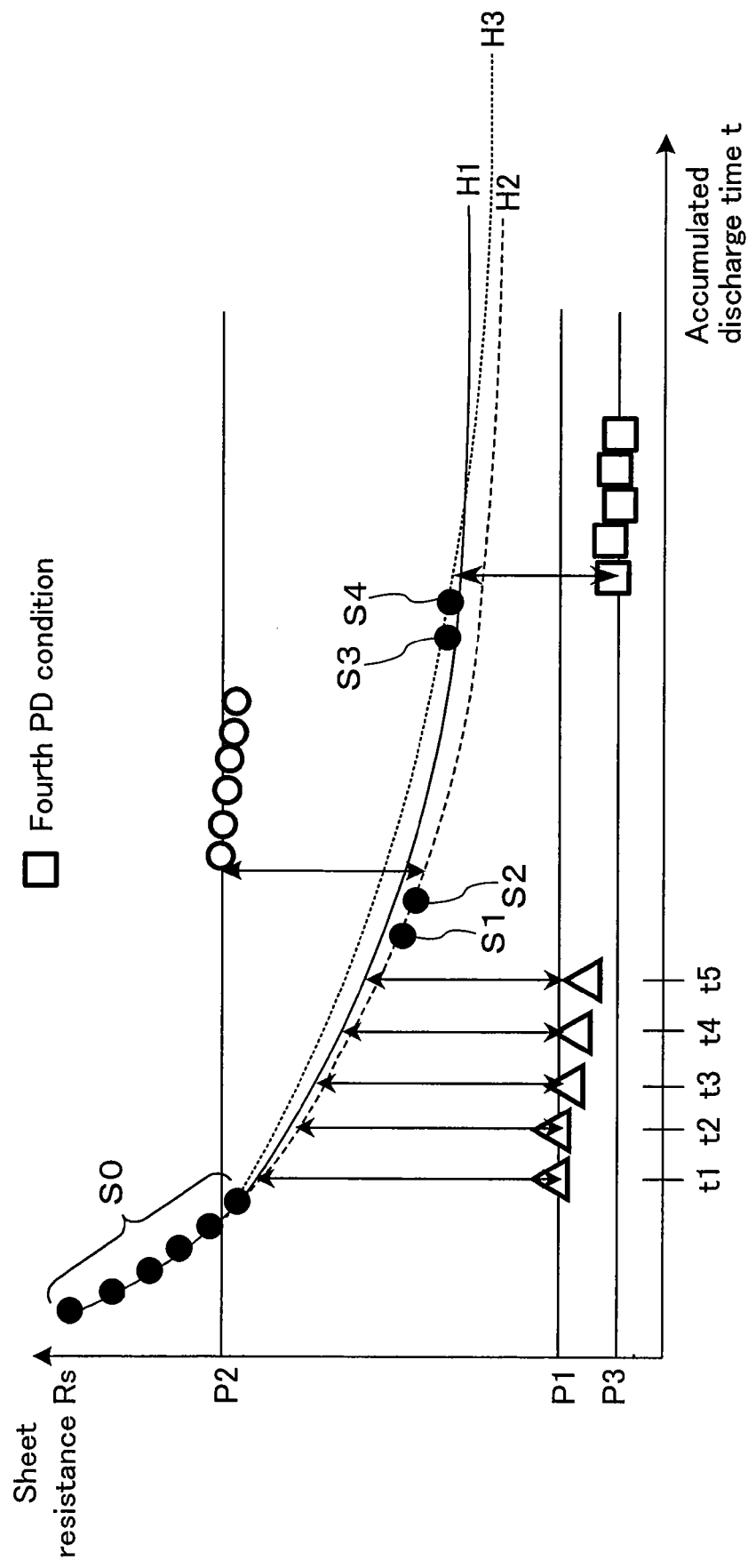
FIG. 23 is a graph illustrating a method for correcting the plasma doping condition in a method for producing a semiconductor device according to a third embodiment of the present invention.

FIG. 23 is a graph illustrating a method for correcting the plasma doping condition in a method for producing a semiconductor device of the present embodiment. In the present embodiment, a reference plasma doping condition is set in advance, and then the target value (the target value of the sheet resistance in the present embodiment) is changed. The present embodiment is effective in a case where, for example, a wide variety of devices are produced in smaller lots, specifically, where it is necessary to change the dose target value every 200 substrates processed. The plasma doping condition correction method of the present embodiment differs from that of the first embodiment as follows.

Specifically, as shown in FIG. 23, the first plasma doping condition being a reference condition is first set (see step S103 in FIG. 1), and then a plasma doping process is performed under the first plasma doping condition. Then, there is a correlation between the accumulated discharge time and the sheet resistance represented by the curve H1. The relationship represented by the curve H1 can be obtained by using a data set S0 of the sheet resistance obtained from two or more samples plasma-doped under the first plasma doping condition.

In the step of determining the correction expression (the preliminary process), the first plasma doping condition is corrected to obtain the second plasma doping condition based on the amount of shift (P1-H1) from the target value (the first target value P1) as estimated by the correlation H1 obtained for the first plasma doping condition. By performing a plasma doping process under the obtained second plasma doping condition, it is possible to obtain an intended dose.

In the step of determining the correction expression (the preliminary process), it is possible to more precisely correct the plasma doping condition when the amount by which the plasma doping condition is corrected is represented as a function of the accumulated discharge time t. The reason for this will now be described with reference to FIG. 23, for example. The amount of shift (P1-H1) above is a function of the accumulated discharge time t, and the amount of shift at t1 in the range of the accumulated discharge time from t1 to t5 (t1<t2<t3<t4<t5) is larger than that at t2. Thus, the amount by which the plasma doping condition is corrected at t1 is set to be greater than that at t2. Thereafter, the amount by which the plasma doping condition is corrected is set to gradually decrease as the accumulated discharge time increases from t1 to t2, t3, t4 and t5. By thus correcting the plasma doping condition, it is possible to more precisely obtain an intended dose.

Next, a case where the target value of the sheet resistance is changed from P1 to P2 will be described.

After completion of the plasma doping process in which the target value of the sheet resistance is P1 as described above, a sample such as a dummy wafer is plasma-doped under the first plasma doping condition, and the sheet resistance of the sample is measured. While measured data S1 and S2 are obtained at two different points of accumulated discharge time in the present embodiment, S1 and S2 are both shifted from the curve H1 to one degree or another. Specifically, upon completion of the plasma doping process in which the target value of the sheet resistance is P1, the relationship between the sheet resistance (i.e., the dose) and the accumulated discharge time shifts from the curve H1 due to the plasma doping process and becomes as represented by the curve H2, which is calculated from the sheet resistance data set S0 and S1 and S2.

Thus, upon completion of the plasma doping process in which the target value of the sheet resistance is P1, the first plasma doping condition is corrected to obtain a third plasma doping condition based on the amount of shift (P2-H2) from the target value (second target value P2) as estimated from the correlation H2. By performing a plasma doping process under the obtained third plasma doping condition, it is possible to obtain an intended dose.

The above similarly applies when the target value of the sheet resistance is changed from P2 to P3.

After completion of the plasma doping process in which the target value of the sheet resistance is P2 as described above, a sample such as a dummy wafer is plasma-doped under the first plasma doping condition, and the sheet resistance of the sample is measured. While measured data S3 and S4 are obtained at two different points of accumulated discharge time in the present embodiment, S3 and S4 are both shifted from the curve H2 to one degree or another. Specifically, upon completion of the plasma doping process in which the target value of the sheet resistance is P2, the relationship between the sheet resistance (i.e., the dose) and the accumulated discharge time shifts from the curve H2 due to the plasma doping process and becomes as represented by the curve H3, which is calculated from the sheet resistance data set S0 and S1, S2, S3 and S4.

Thus, upon completion of the plasma doping process in which the target value of the sheet resistance is P2, the first plasma doping condition is corrected to obtain a fourth plasma doping condition based on the amount of shift (P3-H3) from the target value (third target value P3) as estimated from the correlation H3. By performing a plasma doping process under the obtained fourth plasma doping condition, it is possible to obtain an intended dose.

The embodiments of the present invention set forth above illustrate only some of the variations with respect to the configuration, shape, arrangement, etc., of the plasma doping apparatus (particularly, the vacuum chamber being the process chamber thereof), which can be realized by the application of the present invention. It is understood that the present invention can be applied to realize various variations other than those illustrated in the embodiments above.

While the embodiments of the present invention set forth above are directed to cases where the sample (subject substrate) is a semiconductor substrate of silicon, the present invention can be applied to processing of samples of various other materials. For example, the present invention is also effective for a strained silicon substrate composed of silicon and germanium, a germanium substrate, an SOI substrate, a thin film semiconductor such as a thin amorphous silicon film formed on a glass substrate, etc. The reason is that these samples are similar to a silicon substrate in the structure of the surface portion, which is exposed to a plasma.

While the embodiments of the present invention set forth above are directed to cases where the introduced impurity is boron, the present invention is effective also when the impurity is arsenic, phosphorus, aluminum, antimony, or the like, as long as the sample is a semiconductor substrate. The reason is that with these impurities, it is possible to form an impurity region of a shallow junction in the impurity formation region.

Assuming that the impurity is boron, $B_2H_6$ is used as a boron-containing gas for producing a plasma in the embodiments of the present invention set forth above. However, the present invention is not limited to this, and a gas containing molecules $B_mH_n$, (where m and n are natural numbers) of boron atoms and hydrogen atoms may be used. In a case where a mixed gas of $B_2H_6$ and helium is used, the concentration of $B_2H_6$ in the mixed gas is preferably greater than or equal to 0.01% by mass and less than or equal to 1% by mass. As the boron-containing gas, $BF_3$ may be used instead of a gas containing $B_mH_n$ (where m and n are natural numbers), and $AsH_4$, $PH_3$, or the like, may be used as a gas containing an impurity other than boron.

In cases where the concentration of the gas containing an impurity is low, the present invention described in the first to third embodiments is effective, and is particularly effective as a plasma doping method in which it is required to control the dose with a high precision.

While plasma doping described in the first to third embodiments is directed to a case where the gas supplied into the vacuum chamber (reaction chamber) is a gas containing the doping material, the present invention is also effective in cases where the gas supplied into the reaction chamber does not contain the doping material, wherein the doping material is generated from the impurity in a solid form. Specifically, the present invention is also effective in cases where, for example, a solid substance including impurity atoms is placed in the reaction chamber, and the impurity atoms are made into a plasma by using a plasma of He, or the like, for performing a plasma doping process.

INDUSTRIAL APPLICABILITY

According to the present invention, it is possible to precisely control the amount of impurity to be introduced, whereby it is possible to form an impurity region of a shallow junction. Therefore, the present invention is also useful in applications such as manufacturing thin-film devices such as thin-film transistors used in the filed of LCDs, in addition to the process of introducing an impurity into a bulk semiconductor such as a silicon substrate.

The invention claimed is:

1. A method for producing a semiconductor device, in which a plasma of a gas containing an impurity is produced through a discharge in a vacuum chamber, and a plurality of substrates are successively doped with the impurity by using the plasma, wherein a plasma doping condition of a subject substrate is adjusted based on an accumulated discharge time until the subject substrate is placed in the vacuum chamber.

2. The method for producing a semiconductor device of claim 1, wherein before the plurality of substrates are successively doped with the impurity, a reference plasma doping condition is set and a plurality of dummy substrates are successively doped with the impurity under the plasma doping condition to obtain a correlation between the accumulated discharge time and dose or sheet resistance, and the plasma doping condition for the subject substrate is adjusted by using the correlation.

3. The method for producing a semiconductor device of claim 2, wherein an amount of shift of a dose or a sheet resistance from a target value at an accumulated discharge time until the subject substrate is placed in the vacuum chamber is estimated by using the correlation, and the plasma doping condition for the subject substrate is adjusted based on the estimation.

4. A method for producing a semiconductor device, in which a plasma of a gas containing an impurity is produced through a discharge in a vacuum chamber, and an impurity region is formed in a surface of a substrate by exposing the substrate to the plasma, the method comprising:
a step (a) of setting a first plasma doping condition being a reference condition;
a step (b) of correcting the first plasma doping condition to set a second plasma doping condition so that a dose of the impurity to be introduced into the substrate becomes equal to a target value, based on an accumulated discharge time until the substrate is placed in the vacuum chamber; and
a step (c) of plasma-doping the substrate with the impurity under the second plasma doping condition set in the step (b) to form the impurity region.

5. The method for producing a semiconductor device of claim 4, further comprising a step (d) of cleaning an inside of the vacuum chamber, wherein the accumulated discharge time is an accumulated discharge time since the step (d).

6. The method for producing a semiconductor device of claim 4, wherein the step (b) includes a step in which at least two separate substrates are plasma-doped with the impurity in the vacuum chamber in advance under the first plasma doping condition at different accumulated discharge times from each other, and a dose of each of the separate substrates is measured, after which the first plasma doping condition is corrected to set the second plasma doping condition based on a relationship between the accumulated discharge time until each of the separate substrates is placed in the vacuum chamber and the dose measured for that substrate.

7. The method for producing a semiconductor device of claim 6, wherein:
a region for dose measurement is provided in a portion of each of the separate substrates; and
the measurement of the dose of each of the separate substrates in the step (b) is performed by using the region for dose measurement of that substrate.

8. The method for producing a semiconductor device of claim 6, wherein the step (b) includes a step in which the target value of the dose of the impurity to be introduced into the substrate is changed, and the first plasma doping condition is corrected to set a third plasma doping condition based on a difference between the changed target value and a dose estimated based on the relationship.

9. The method for producing a semiconductor device of claim 6, wherein the step (b) includes a step of determining parameters A and B in (Expression 1) below by using the doses measured for the separate substrates $$y = -A \cdot \mathrm{Ln}(t) + B \quad \text{(Expression 1)}$$

(where y is the sheet resistance, Ln is the natural logarithm, and t is the accumulated discharge time).

10. The method for producing a semiconductor device of claim 6, wherein the step (b) includes a step of determining parameters A and B in (Expression 2) below by using the doses measured for the separate substrates $$y = A \cdot t^{-B} \quad \text{(Expression 2)}$$

(where y is the sheet resistance, and t is the accumulated discharge time).

11. The method for producing a semiconductor device of claim 4, wherein the step (b) includes a step of correcting a plasma doping time based on an accumulated discharge time until the substrate is placed in the vacuum chamber.

12. The method for producing a semiconductor device of claim 4, wherein the step (b) includes a step of correcting a concentration of the gas based on an accumulated discharge time until the substrate is placed in the vacuum chamber.

13. The method for producing a semiconductor device of claim 4, wherein the step (b) includes a step of correcting a flow rate of the gas based on an accumulated discharge time until the substrate is placed in the vacuum chamber.

14. The method for producing a semiconductor device of claim 4, wherein a distance between a susceptor on which the substrate is provided in the vacuum chamber and a supply section for supplying the gas is kept constant.

15. The method for producing a semiconductor device of claim 4, wherein the gas contains molecules $B_m H_n$ (where m and n are natural numbers) composed of boron atoms and hydrogen atoms.

16. The method for producing a semiconductor device of claim 4, wherein the gas is a mixed gas of a boron atom-containing gas and helium.

17. The method for producing a semiconductor device of claim 16, wherein the boron atom-containing gas is $B_2H_6$.

18. The method for producing a semiconductor device of claim 17, wherein a concentration of $B_2H_6$ in the mixed gas is greater than or equal to 0.01% by mass and less than or equal to 1% by mass.

19. The method for producing a semiconductor device of claim 4, wherein the gas contains $BF_3$, $AsH_4$ or $PH_3$.

20. The method for producing a semiconductor device of claim 4, wherein the substrate is a silicon substrate.

21. A semiconductor producing apparatus for forming an impurity region in a surface of a substrate by exposing the substrate to a plasma of a gas containing an impurity, the semiconductor producing apparatus comprising:
a vacuum chamber;
a gas supplying section for supplying the gas into the vacuum chamber;
an exhausting section for exhausting the vacuum chamber;
a plasma generating section for making the gas supplied into the vacuum chamber by the gas supplying section into a plasma through a discharge; and
a plasma doping condition control section for controlling a plasma doping condition,
wherein the plasma doping condition control section sets a first plasma doping condition being a reference condition, and corrects the first plasma doping condition to set a second plasma doping condition so that a dose of the impurity to be introduced into the substrate becomes equal to a target value, based on an accumulated discharge time until the substrate is placed in the vacuum chamber.

22. The semiconductor producing apparatus of claim 21, further comprising a counter for counting the accumulated discharge time, wherein the plasma doping condition control section corrects the first plasma doping condition to set the second plasma doping condition based on the accumulated discharge time obtained by the counter.

* * * * *